(12) United States Patent
Asano

(10) Patent No.: US 7,737,419 B2
(45) Date of Patent: Jun. 15, 2010

(54) ALIGNMENT APPARATUS, EXPOSURE APPARATUS, AND DEVICE MANUFACTURING METHOD

(75) Inventor: Tosiya Asano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 362 days.

(21) Appl. No.: 11/761,951

(22) Filed: Jun. 12, 2007

(65) Prior Publication Data

US 2008/0067415 A1 Mar. 20, 2008

(30) Foreign Application Priority Data

Jun. 20, 2006 (JP) .............................. 2006-170757

(51) Int. Cl.
*H01L 21/027* (2006.01)
*G03F 7/20* (2006.01)

(52) U.S. Cl. .............................. 250/492.2; 250/442.11; 355/53; 355/72; 310/12.06; 310/12.31; 310/15; 318/135

(58) Field of Classification Search ............ 250/442.11; 355/53, 72; 310/12.06, 12.31, 15, 12; 318/135
See application file for complete search history.

(56) References Cited

U.S. PATENT DOCUMENTS 4,654,571 A * 3/1987 Hinds ........................ 318/687
4,705,951 A * 11/1987 Layman et al. ......... 250/442.11
6,097,114 A * 8/2000 Hazelton .................. 310/12.06
6,452,292 B1 * 9/2002 Binnard .................... 310/12.06
6,618,120 B2 * 9/2003 Ueta ............................ 355/72

FOREIGN PATENT DOCUMENTS

JP 2001203140 A * 7/2001
JP 2003022960 A * 1/2003

* cited by examiner

*Primary Examiner*—Jack I Berman
(74) *Attorney, Agent, or Firm*—Canon U.S.A., Inc. I.P. Division

(57) ABSTRACT

At least one exemplary embodiment is directed to an alignment apparatus which includes a moving member, a structural object arranged on the moving member, and an electromagnetic actuator which moves the structural object relative to the moving member. The electromagnetic actuator includes a plurality of linear motor units, which apply forces in the horizontal direction and the vertical direction to the structural object. The plurality of linear motor units apply, to the structural object, forces in the rotation direction about each of two axes orthogonal to each other in the horizontal plane and the rotation direction about the axis in the vertical direction.

9 Claims, 20 Drawing Sheets

ALIGNMENT APPARATUS, EXPOSURE APPARATUS, AND DEVICE MANUFACTURING METHOD

BACKGROUND OF THE INVENTION

1. Field of the Invention

The present invention relates to an alignment apparatus, exposure apparatus, and device manufacturing method.

2. Description of the Related Art

As discussed in Japanese Patent Laid-Open No. 2003-22960, there has conventionally been proposed an alignment apparatus (stage apparatus) using linear motors.

As discussed in Japanese Patent Laid-Open No. 2001-203140, there has also conventionally been proposed an alignment apparatus (stage apparatus) using electromagnets.

As shown in FIG. 19, an alignment apparatus 700 of Japanese Patent Laid-Open No. 2003-22960 interposes linear motors 741 and 742 between a fine moving stage 710 and a coarse moving stage 730. More specifically, in the linear motors 741 and 742, the Lorentz force acts between linear motor movable elements 741a and 742a attached to the fine moving stage 710 and linear motor stators 741b and 742b attached to the coarse moving stage 730. This makes it possible to drive the fine moving stage 710 in the horizontal direction and vertical direction relative to the coarse moving stage 730.

However, the alignment apparatus 700 of Japanese Application Publication No. 2003-22960 has an arrangement in which the linear motor movable element 742a readily vibrates the fine moving stage 710 because the linear motor movable element 742a is cantilevered to the fine moving stage 710. The point of impact of a control force, which acts on the fine moving stage corresponds to the position where each linear motor is set. When a linear motor, which drives the fine moving stage in the vertical direction is positioned at the edge of the fine moving stage, its elastic mode is readily excited. For these reasons, the fine moving stage 710 may deform to result in a decrease in its alignment accuracy.

As shown in FIG. 20, an alignment apparatus 800 of Japanese Patent Laid-Open No. 2001-203140 interposes electromagnets between a fine moving stage 810 and a coarse moving stage 830. More specifically, a magnetic attraction force acts between electromagnets 841a, 842a, 843a, and 844a attached to the fine moving stage 810 and iron pieces 841b, 842b, 843b, and 844b attached to the coarse moving stage 830. This makes it possible to drive the fine moving stage 810 in the vertical direction relative to the coarse moving stage 830.

However, the alignment apparatus 800 of Japanese Patent Laid-Open No. 2001-203140 attaches the electromagnets 841a, 842a, 843a, and 844a to the neighborhoods of the four corners of the fine moving stage 810. When a driving force in the vertical direction is transmitted to the fine moving stage 810, the fine moving stage 810 may locally deform. This may decrease the alignment accuracy of the fine moving stage 810.

SUMMARY OF THE INVENTION

At least one exemplary embodiment of the present invention is directed to an alignment apparatus, exposure apparatus, and device manufacturing method capable of suppressing a decrease in alignment accuracy of, for example, a structural object.

At least one exemplary embodiment of the present invention is directed to an alignment apparatus comprising: a moving member; a structural object arranged on the moving member; and an electromagnetic actuator which moves the structural object relative to the moving member, the electromagnetic actuator including a plurality of linear motor units which apply forces in a horizontal direction and a vertical direction to the structural object, and the plurality of linear motor units applying, to the structural object, forces in a rotational direction about each of two axes orthogonal to each other in a horizontal plane and a rotational direction about an axis in the vertical direction.

At least one further exemplary embodiment of the present invention is directed to an exposure apparatus comprising: an optical system to project, onto a substrate, exposure light which irradiates a master on which a pattern is formed; and the above-described alignment apparatus to hold and align the substrate.

At least one exemplary embodiment of the present invention is directed to a device manufacturing method comprising: a preparation step of preparing a substrate on which a latent image pattern is formed using the above-described exposure apparatus; and a development step of developing the latent image pattern.

According to at least one exemplary embodiment of the present invention, one can suppress a decrease in alignment accuracy of a structural object.

Further features of the present invention will become apparent from the following description of exemplary embodiments with reference to the attached drawings.

DESCRIPTION OF THE EMBODIMENTS

Figure 1:
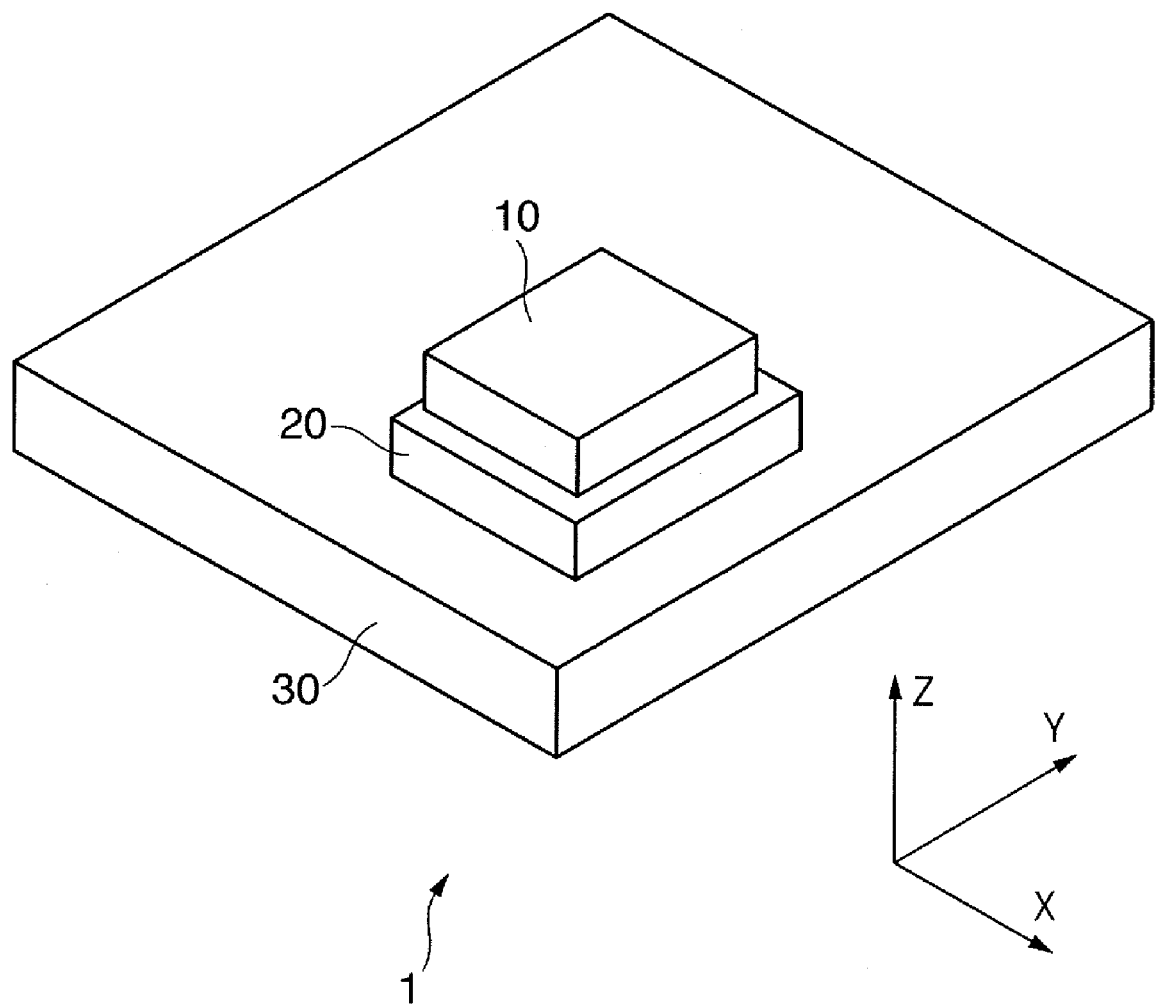
FIG. 1 is a perspective view showing a wafer stage apparatus 1 according to the first exemplary embodiment of the present invention.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the magnetic coils and their materials.

In all of the examples illustrated and discussed herein any specific values, for example the interval between magnetic cores, should be interpreted to be illustrative only and non-limiting. Thus, other examples of the exemplary embodiments could have different values.

Notice that similar reference numerals and letters refer to similar items in the following figures, and thus once an item is defined in one figure, it may not be discussed for following figures.

Note that herein when referring to correcting or corrections of an error (e.g., an alignment error), a reduction of the error and/or a correction of the error is intended.

A wafer stage apparatus according to the first exemplary embodiment of the present invention will be described with reference to FIGS. 1 to 4.

FIG. 1 is a perspective view showing a wafer stage. Referring to FIG. 1, the vertically upward direction is defined as the +Z direction, the direction from the upper left toward the lower right on the drawing is defined as the +X direction, and the direction from the lower left toward the upper right on the drawing is defined as the +Y direction. The +X direction and +Y direction are different directions in the horizontal plane. The θx direction is defined as the rotation direction about the X-axis. The θy direction is defined as the rotation direction about the Y-axis. The θz direction is defined as the rotation direction about the Z-axis. The same applies to the other drawings. As shown in FIG. 1, a wafer stage apparatus (alignment apparatus) 1 comprises a fine moving stage (structural object) 10, coarse moving stage (moving member) 20, coarse moving stage base 30, and a linear motor unit group 40 including linear motor units 41, 42, 43, and 44 shown in FIG. 2.

The coarse moving stage base 30 has an almost rectangular plate shape. The coarse moving stage base 30 extends in the X-Y plane direction.

The coarse moving stage 20 is arranged on the coarse moving stage base 30. The coarse moving stage 20 has an almost rectangular plate shape. A planar motor (not shown) drives the coarse moving stage 20 on the coarse moving stage base 30 in the X direction and Y direction. The coarse moving stage 20 moves by a large stroke together with the fine moving stage 10.

A means for driving the coarse moving stage 20 is not limited to a planar motor. For example, an arrangement in which an X slider stage is formed on a Y slider stage or a cross-shaped stage in which an intermediate stage is inserted at an intersection between an X slider and a Y slider may be used. Any arrangement may be used as long as the coarse moving stage 20 moves together with the fine moving stage 10 while the coarse moving stage 20 may be arranged under the fine moving stage 10. A known technique can be used as a method of driving and controlling the coarse moving stage 20.

The fine moving stage 10 is arranged on the coarse moving stage 20. The fine moving stage 10 has an almost rectangular plate shape. The fine moving stage 10 moves on the coarse moving stage 20 by a small stroke.

The linear motor unit group 40 is interposed between the fine moving stage 10 and the coarse moving stage 20. The linear motor unit group 40 drives the fine moving stage 10 on the coarse moving stage 20 in the X direction, Y direction, Z direction, θx direction, θy direction, and θz direction.

Figure 2:
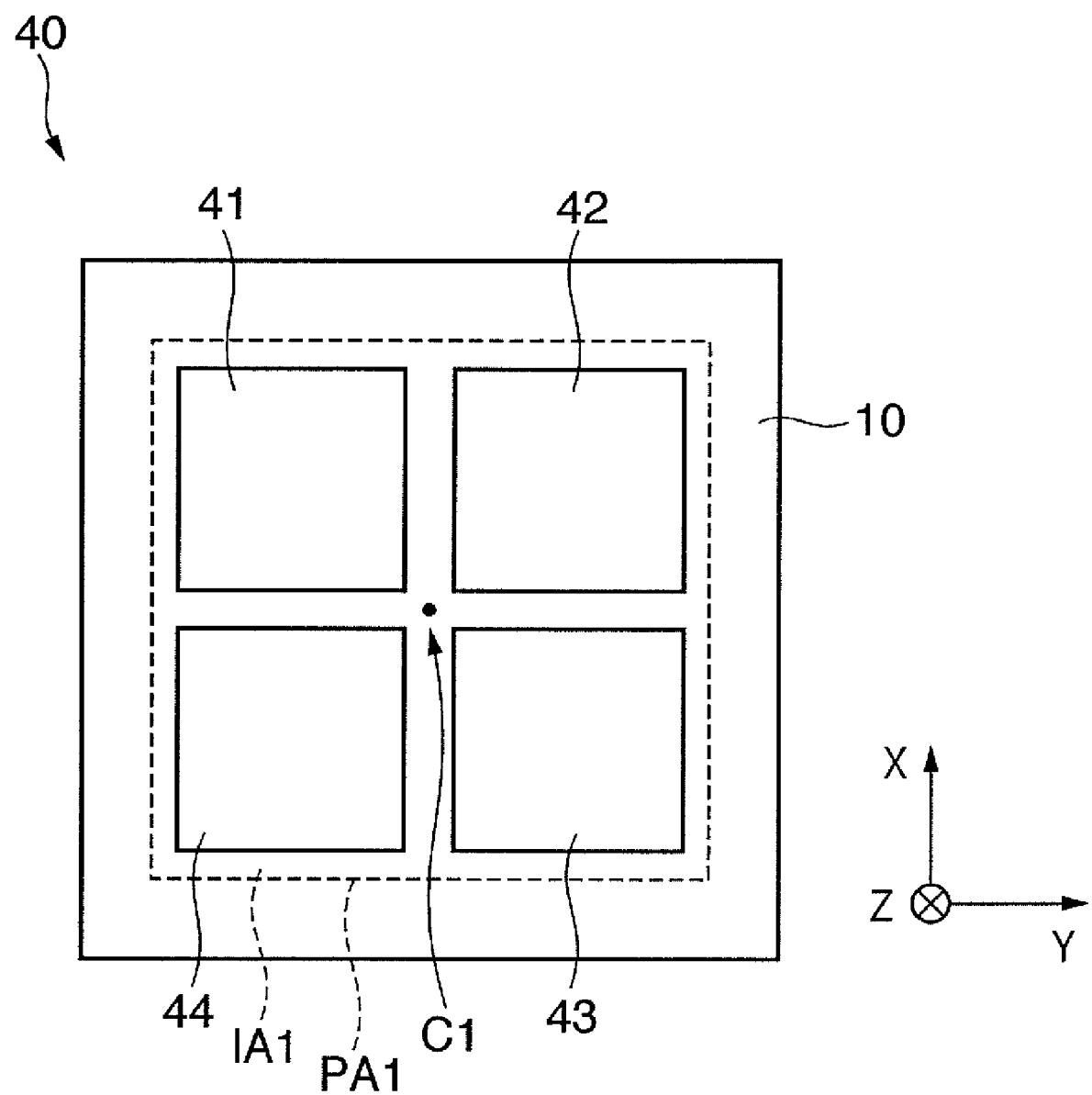
FIG. 2 is a view when a fine moving stage is seen from the −Z direction.

FIG. 2 is a view when the fine moving stage is seen from the −Z direction. The linear motor unit group 40 comprises the first linear motor unit (electromagnetic actuator) 41, second linear motor unit (electromagnetic actuator) 42, third linear motor unit (electromagnetic actuator) 43, and fourth linear motor unit (electromagnetic actuator) 44.

The first linear motor unit 41 is laid out along the lower surface of the fine moving stage 10. The first linear motor unit 41 can two-dimensionally support the fine moving stage 10.

At a position adjacent to the first linear motor unit 41, the second linear motor unit 42 is laid out along the lower surface of the fine moving stage 10. The second linear motor unit 42 can two-dimensionally support the fine moving stage 10.

At a position adjacent to the first linear motor unit 41 and second linear motor unit 42, the third linear motor unit 43 is laid out along the lower surface of the fine moving stage 10. The third linear motor unit 43 can two-dimensionally support the fine moving stage 10.

At a position adjacent to the first linear motor unit 41 and third linear motor unit 43, the fourth linear motor unit 44 extends along the lower surface of the fine moving stage 10. The fourth linear motor unit 44 can two-dimensionally support the fine moving stage 10.

The first linear motor unit 41 to fourth linear motor unit 44 are laid out to be symmetric with respect to a barycenter C1 of the fine moving stage 10. The first linear motor unit 41 to fourth linear motor unit 44 can almost uniformly support the fine moving stage 10.

The fine moving stage 10 includes a surrounding area PA1 and inner area IA1. The inner area IA1 is an area inside the surrounding area PA1. While the first linear motor unit 41 to fourth linear motor unit 44 are not arranged in the surrounding area PA1, they are arranged in the inner area IA1.

Each of the first linear motor unit 41 and third linear motor unit 43 generate driving forces in both of the Y direction and Z direction, respectively. Each of the second linear motor unit 42 and fourth linear motor unit 44 generate driving forces in both of the X direction and Z direction, respectively.

That is, each of the second linear motor unit 42 and fourth linear motor unit 44 generates a driving force in the X direction. Each of the first linear motor unit 41 and third linear motor unit 43 generates a driving force in the Y direction. Each of the first linear motor unit 41, second linear motor unit 42, third linear motor unit 43, and fourth linear motor unit 44 generates a driving force in the Z direction.

A driving force in the Z direction is produced in a wide area on the lower surface of the fine moving stage 10. Local stress concentration upon transmitting the driving force in the Z direction to the fine moving stage 10 is avoided. This reduces local deformation of the fine moving stage 10.

A driving force in the θx direction is produced by the difference between the sum of the driving forces in the Z direction by the first linear motor unit 41 and second linear motor unit 42 and the sum of the driving forces in the Z direction by the third linear motor unit 43 and fourth linear motor unit 44. A driving force in the θy direction is produced by the difference between the sum of the driving forces in the Z direction by the first linear motor unit 41 and fourth linear motor unit 44 and the sum of the driving forces in the Z direction by the second linear motor unit 42 and third linear motor unit 43. A driving force in the θz direction is produced by the difference between the driving force in the X direction by the second linear motor unit 42 and the driving force in the X direction by the fourth linear motor unit 44.

In this manner, the linear motor unit group 40 generates driving forces in the six-axis directions, i.e., X direction, Y direction, Z direction, θx direction, θy direction, and θz direction.

A driving force in the θz direction can be produced by the difference between the driving force in the Y direction by the first linear motor unit 41 and the driving force in the Y direction by the third linear motor unit 43.

A position measurement system of the fine moving stage 10 can use a six-axis measurement system using a known laser interferometer. The six-axis measurement system comprises a laser interferometer prepared as a measurement reference and a reflecting mirror, which is arranged on the fine moving stage and reflects a laser beam. Using this six-axis measurement system one can measure the position of the fine moving stage 10. One can use a known PID control system to align the fine moving stage. Sending a control command to a current driver which drives each of the linear motor units 41, 42, 43, and 44 one can control the linear motor units 41, 42, 43, and 44 to generate driving forces so as to align the fine moving stage 10.

The detailed arrangement of the first linear motor unit will be explained with reference to FIG. 3. The arrangement of the third linear motor unit 43 is the same as that of the first linear motor unit 41. The arrangements of the second linear motor unit 42 and fourth linear motor unit 44 are the same as an arrangement in which the first linear motor unit 41 is rotated through 90° in the X-Y plane. Therefore, a description of the second linear motor unit 42 to fourth linear motor unit 44 will be omitted.

Figure 3:
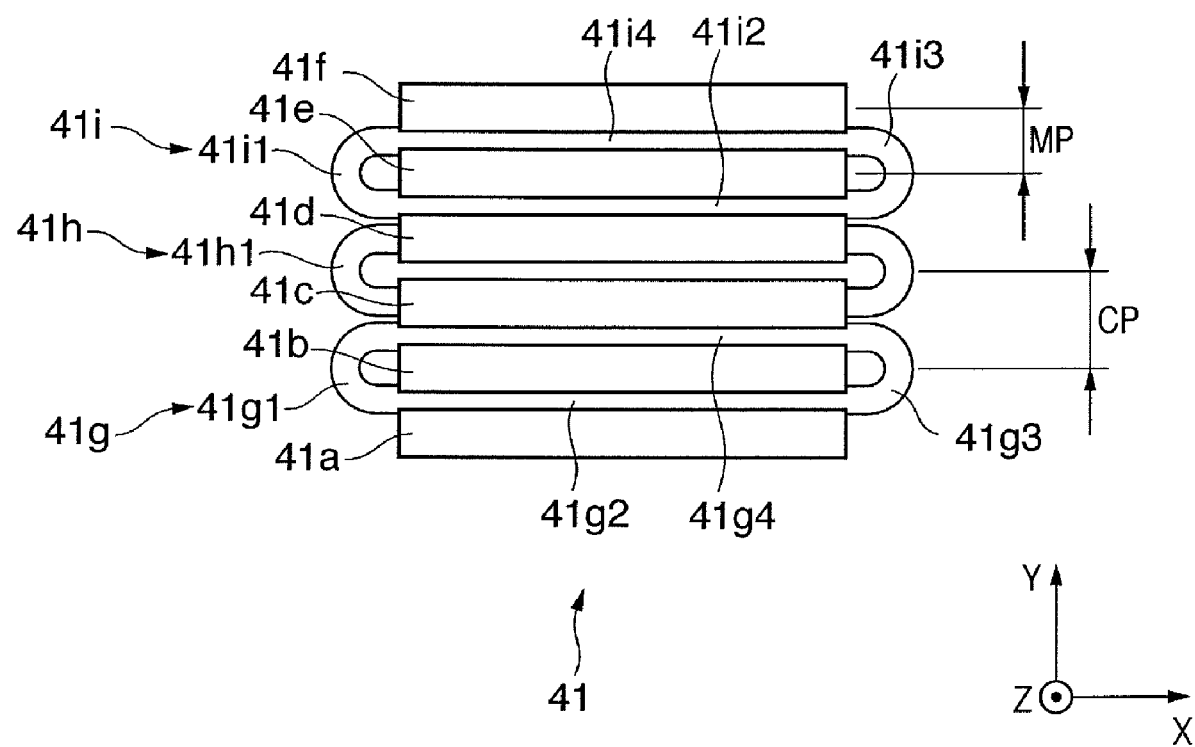
FIG. 3 is a view showing the arrangement of a first linear motor unit.

As shown in FIG. 3, the first linear motor unit 41 comprises a first magnet unit (first element) including magnets 41a, 41b, 41c, 41d, 41e, and 41f and a first coil unit (second element) including the coils 41g, 41h, and 41i.

The first magnet unit includes the plurality of magnets 41a, 41b, 41c, 41d, 41e, and 41f. The magnets 41a, 41c, and 41e are magnetized in the +Z direction, while the magnets 41b, 41d, and 41f are magnetized in the −Z direction (see FIG. 4). The magnets 41a, 41b, 41c, 41d, 41e, and 41f align themselves along the Y direction. The magnets 41a, 41b, 41c, 41d, 41e, and 41f extend parallel to each other in the X direction. The first magnet unit has a flat portion, which is in contact with the fine moving stage 10.

The first coil unit includes the plurality of coils 41g, 41h, and 41i. The coils 41g, 41h, and 41i are juxtaposed on the same plane. The coils 41g, 41h, and 41i align themselves along the Y direction around the magnets 41a, 41b, 41c, 41d, 41e, and 41f. The first coil unit has a flat portion, which is in contact with the coarse moving stage 20.

A case in which the first magnet unit is fixed to the fine moving stage 10 while the first coil unit is fixed to the coarse moving stage 20 will be mainly explained below. The same applies to an operation when the first coil unit is fixed to the fine moving stage 10 while the first magnet unit is fixed to the coarse moving stage 20, and a description thereof will be omitted.

Each of the coils 41g, 41h, and 41i includes first straight portions 41g2 and 41g4, 41h2 and 41h4, or 41i2 and 41i4 and first curved portions 41g1 and 41g3, 41h1 and 41h3, or 41i1 and 41i3. The first straight portions 41g2 and 41g4, 41h2 and 41h4, and 41i2 and 41i4 linearly extend in a direction perpendicular to the Y direction in the X-Y plane. The first curved portions 41g1 and 41g3, 41h1 and 41h3, or 41i1 and 41i3 extend in a curve from the first straight portions 41g2 and 41g4, 41h2 and 41h4, or 41i2 and 41i4 so as to connect the two first straight portions 41g2 and 41g4, 41h2 and 41h4, or 41i2 and 41i4.

The magnets 41a, 41b, 41c, 41d, 41e, and 41f align themselves at an interval defined by a distance MP between magnetic poles. The coils 41g, 41h, and 41i align themselves at an interval defined by a distance CP between the centers of coils. The relationship between the distance MP between magnetic poles and the distance CP between the centers of coils is given by:

$$CP = 1.5 \times MP \qquad (1)$$

Figure 4:
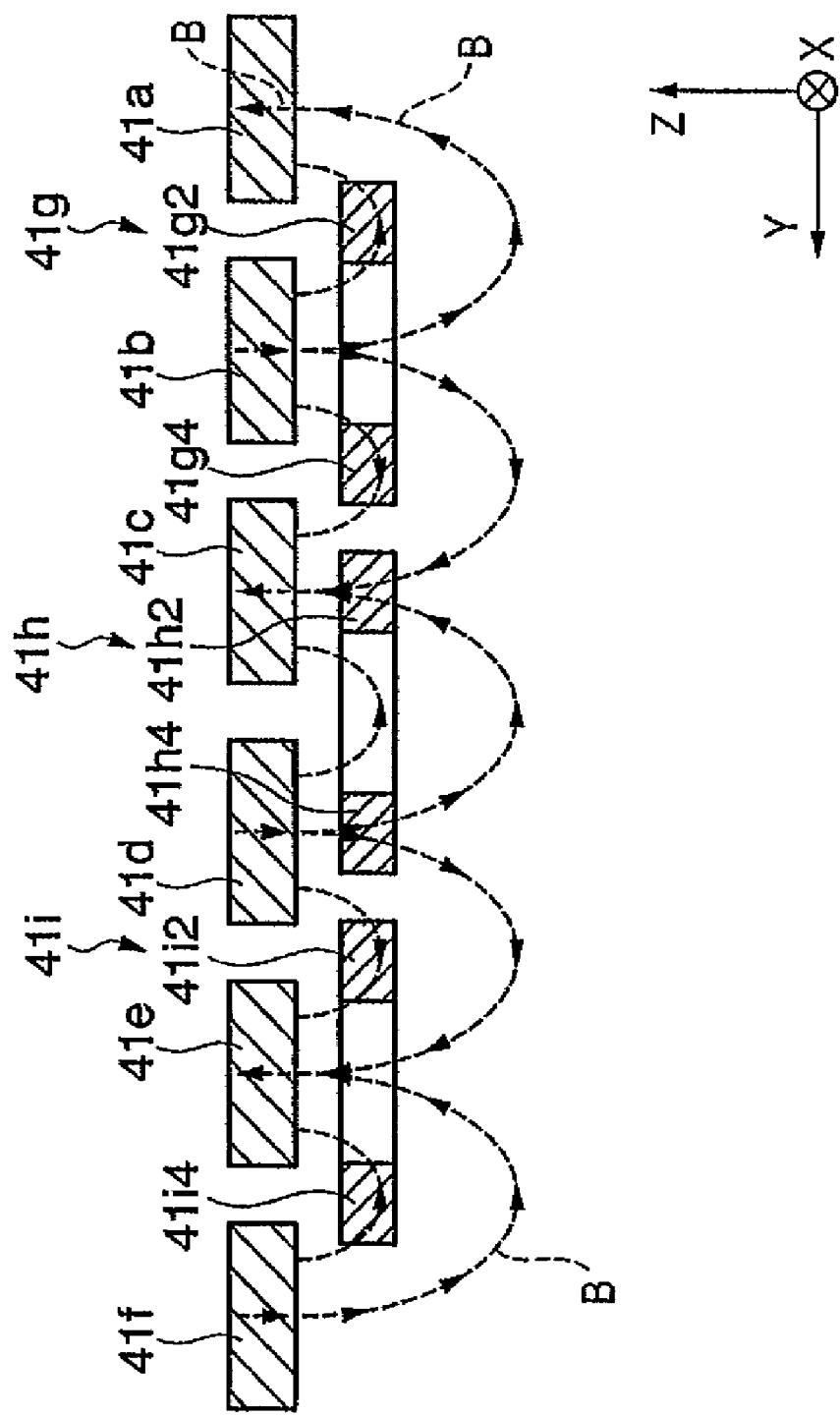
FIG. 4 is a view showing the operation of the first linear motor unit.

FIG. 4 shows an arrangement relationship when the first linear motor unit is seen from the −X direction.

The detailed operation of the first linear motor will be explained with reference to FIG. 4. As described above, the magnets 41a, 41c, and 41e are magnetized in the +Z direction, while the magnets 41b, 41d, and 41f are magnetized in the −Z direction. This generates magnetic fluxes B as indicated by broken lines, around the coils 41g, 41h, and 41i.

For example, a magnetic flux B in the +Z direction generated by the magnets 41d and passes through the second straight portion 41h4 of the coil 41h on the +Y direction side and the first straight portion 41h2 of the coil 41h on the −Y direction side in this order and is directed to the magnet 41c which generate a magnet flux B in the +Z direction. As a current is supplied to the coil 41h clockwise when seen from the +Z direction (see FIG., 3), a current in the +X direction flows through the second straight portion 41h4 on the +Y direction side. The Lorentz force in the +Y direction acts on the second straight portion 41h4 on the +Y direction side by the Faraday's left-hand rule. A force in the −Y direction acts on the magnets 41d and 41c as a reaction force to the Lorentz force.

For example, as a current is supplied to the coil 41h counterclockwise when seen from the +Z direction (see FIG. 3), a current in the −X direction flows through the second straight portion 41h4 on the +Y direction side. The Lorentz force in the +Y direction acts on the second straight portion 41h4 on the +Y direction side by the Faraday's left-hand rule. A force in the +Y direction acts on the magnets 41d and 41c as a reaction force to the Lorentz force.

For example, a magnetic flux B in the +Y direction generated by the magnets 41b runs through a portion interposed between the first straight portion 41g2 and the second straight portion 41g4 and is directed to the magnet 41a and 41c each of which generates a magnet flux B in the +Z direction. As a current is supplied to the coil 41g clockwise when seen from the +Z direction (see FIG. 3), a current in the +X direction flows through the second straight portion 41g4 on the +Y direction side. The Lorentz force in the +Z direction acts on the second straight portion 41g4 on the +Y direction side by the Faraday's left-hand rule. A force in the −Z direction acts on the magnets 41b and 41a as a reaction force to the Lorentz force.

For example, as a current is supplied to the coil 41g counterclockwise when seen from the +Z direction (see FIG. 3), a current in the −X direction flows through the second straight portion 41g4 on the +Y direction side. The Lorentz force in the −Z direction acts on the second straight portion 41g4 on the +Y direction side by the Faraday's left-hand rule. A force in the +Z direction acts on the magnets 41b and as a reaction force to the Lorentz force.

The operation between the magnets 41f and 41e and the coil 41i is the same as that between the magnets 41b and 41a and the coil 41g. It is desirable during control that the coils 41i and 41g generate forces in the Z direction while the coil 41h generates a force in the Y direction, and these coils generate no forces having other direction components. In at least one exemplary embodiment, the straight portions of the coils are located below the magnet unit while their curved portions are located far from below the magnet unit. That is, only the straight portion of each coil is arranged in an area where a magnetic flux of the magnet unit has an influence. Although the above description is related to a combination of the Y direction and Z direction, the same applies to a combination of the X direction and Z direction when the linear motor unit is rotated through 90° about the Z-axis.

The arrangement of the linear motor unit is not limited to the above-described exemplary embodiment. To generate thrusts in the Z direction, θx direction, and θy direction, at least three linear motor units whose thrust centers do not exist on one straight line can be used. To generate thrusts in the X direction, Y direction, and θz direction, at least three linear motor units can be used as well. One linear motor unit can generate a thrust in the X direction while two linear motor units can generate thrusts in the Y direction, and vice versa. In addition, the thrust centers of the two linear motor units, which generate thrusts in the same direction and thrusts in the θz direction need only be arranged at a certain interval in a direction perpendicular to that same direction in a horizontal plane parallel to the θz direction. That is, to cause two linear motor units, which generate thrusts in the Y direction, to generate thrusts in the θz direction, their thrust centers need only be arranged at a certain interval in the X direction in the X-Y plane parallel to the θz direction. It is important that the thrust position of the linear motor is located on a coil side. Using long coils as shown in FIG. 3 widens the thrust generation range with respect to the fine moving stage. The conventional single-phase linear motor applies a thrust to the fine moving stage at an almost one point. In contrast, the linear motor according to at least one exemplary embodiment of the present invention applies thrusts to the fine moving stage on a coil side line. This amounts to hardly exciting the elastic mode of the fine moving stage. This one can facilitate an increase in feedback gain of the control system to result in high control performance.

Although not shown in FIG. 1, a wafer chuck arranged on the fine moving stage 10 sets (holds) the wafer around its center. Especially, the deformation of the fine moving stage 10, becomes problematic in immersion exposure. In immersion exposure, since the gap between the wafer and the exposure optical system is filled with a liquid, a force in the −Z direction readily acts on the fine moving stage 10. The fine moving stage 10 readily deforms in the vertical direction. Even in this case, the arrangement according to the first exemplary embodiment of the present invention can suppress the deformation of the fine moving stage 10. This is because the above-described linear motor unit applies a force at almost the center of the fine moving stage to which an immersion liquid is supplied. Consequently, a decrease in alignment accuracy in, e.g., the Z direction is suppressed even in immersion exposure.

A wafer stage apparatus according to the second exemplary embodiment of the present invention will be described next with reference to FIGS. 5 to 8. Constituent parts different from those in the first exemplary embodiment will be mainly explained, and a description of the same constituent parts will be omitted.

Figure 5:
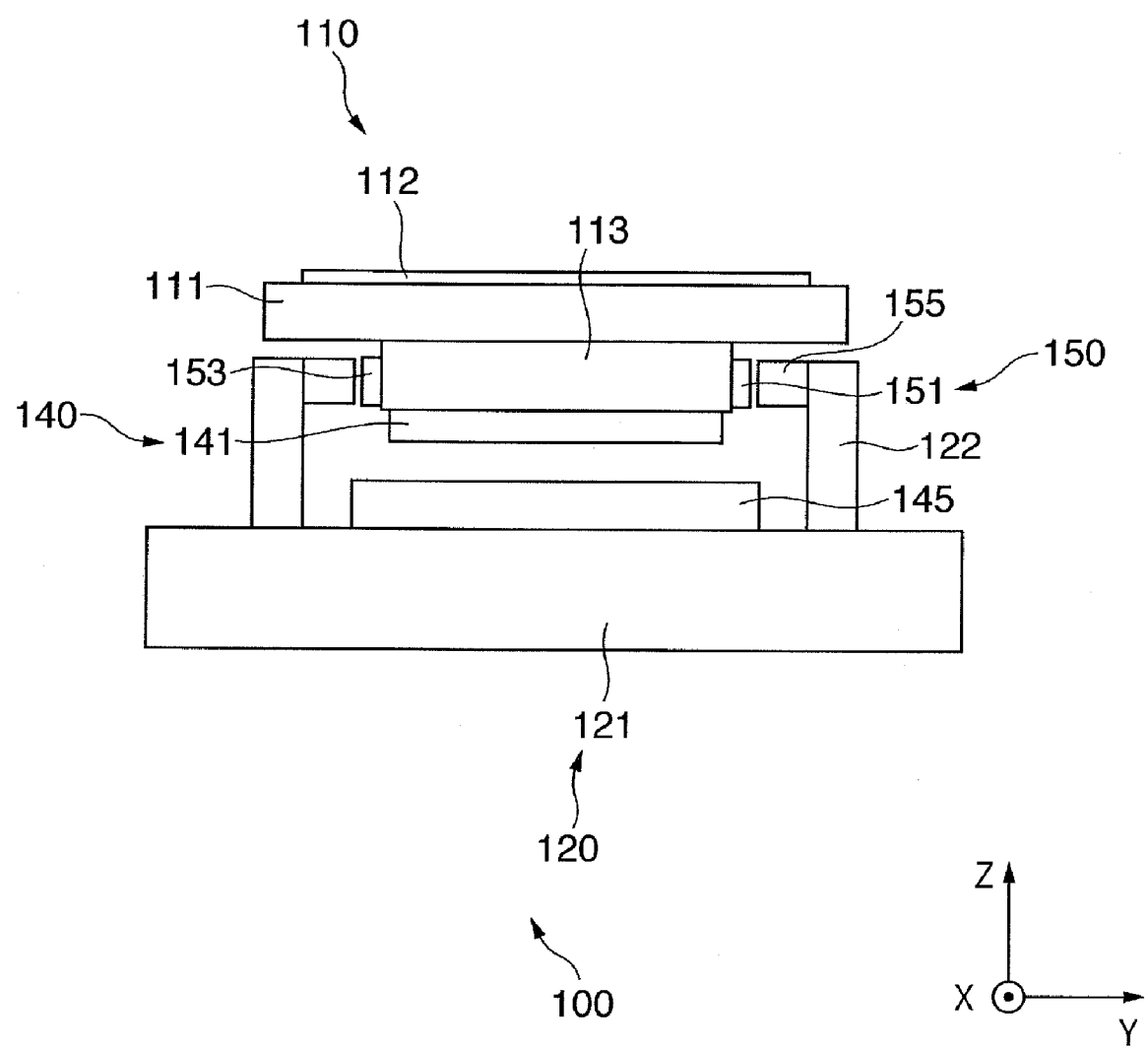
FIG. 5 is a view when a wafer stage apparatus according to the second exemplary embodiment of the present invention is seen from the +X direction.

FIG. 5 is a view when a wafer stage apparatus is seen from the +X direction.

A wafer stage apparatus (alignment apparatus) 100 comprises a fine moving stage (structural object) 110 in place of the fine moving stage 10, and a coarse moving stage (moving member) 120 in place of the coarse moving stage 20. The wafer stage apparatus 100 also comprises a first actuator unit (electromagnetic actuator) 140 in place of the linear motor unit group 40. The wafer stage apparatus 100 also comprises a second actuator unit 150, which applies a force from the coarse moving stage to the fine moving stage.

The fine moving stage 110 includes a fine moving stage top plate 111, wafer chuck 112, and stage lower plate 113. A wafer is mounted on the wafer chuck 112. A barycenter C101 of the fine moving stage 110 is located at a position shown in FIG. 6 when seen through from the +Z direction.

The coarse moving stage 120 includes a main body 121 and electromagnet attachment table 122. The electromagnet attachment table 122 on the +X direction side and the −X direction side are not illustrated in FIG. 5.

The first actuator unit 140 is interposed between the stage lower plate 113 and the coarse moving stage 120 along the lower surface of the stage lower plate 113. The second actuator unit 150 is interposed between the electromagnet attachment table 122 and the side portion of the stage lower plate 113.

Figure 6:
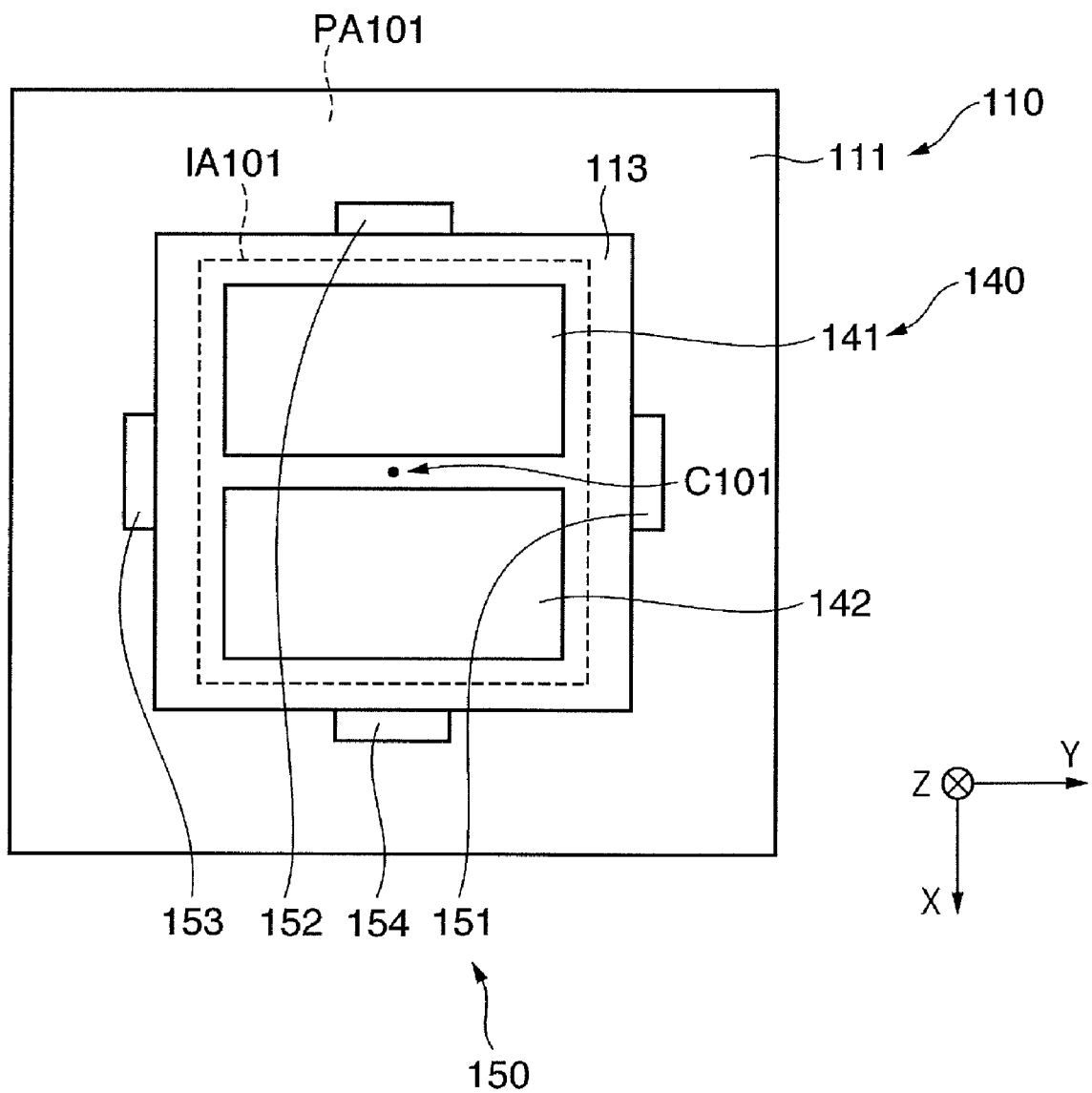
FIG. 6 is a view when a fine moving stage is seen from the −Z direction.

FIG. 6 is a view when the fine moving stage is seen from the −Z direction. As shown in FIGS. 5 and 6, the first actuator unit 140 includes movable magnet units (first elements) 141 and 142. The first actuator unit 140 also includes coil units (second elements) 143 and 144 (see FIG. 8), and cooling jacket 145. The movable magnet unit 141 opposes the coil unit 143. The movable magnet unit 142 opposes the coil unit 144. The movable magnet units 141 and 142 are laid out to be symmetric with respect to the barycenter C101 of the fine moving stage 110 when seen from the −Z direction. Similarly, the coil units 143 and 144 are laid out to be symmetric with respect to the barycenter C101 of the fine moving stage 110 when seen from the −Z direction. The first actuator unit 140 can almost uniformly support the fine moving stage 110.

The fine moving stage 110 includes a surrounding area PA101 and inner area IA101. The inner area IA101 is an area inside the surrounding area PA101. While the first actuator unit 140 is not arranged in the surrounding area PA101, it is arranged in the inner area IA101.

A case in which the movable magnet units 141 and 142 are fixed to the fine moving stage 110 while the coil units 143 and 144 are fixed to the coarse moving stage 120 will be mainly explained below. The same applies to an operation when the coil units 143 and 144 are fixed to the fine moving stage 110 while the movable magnet units 141 and 142 are fixed to the coarse moving stage 120, and a description thereof will be omitted.

Figure 8:
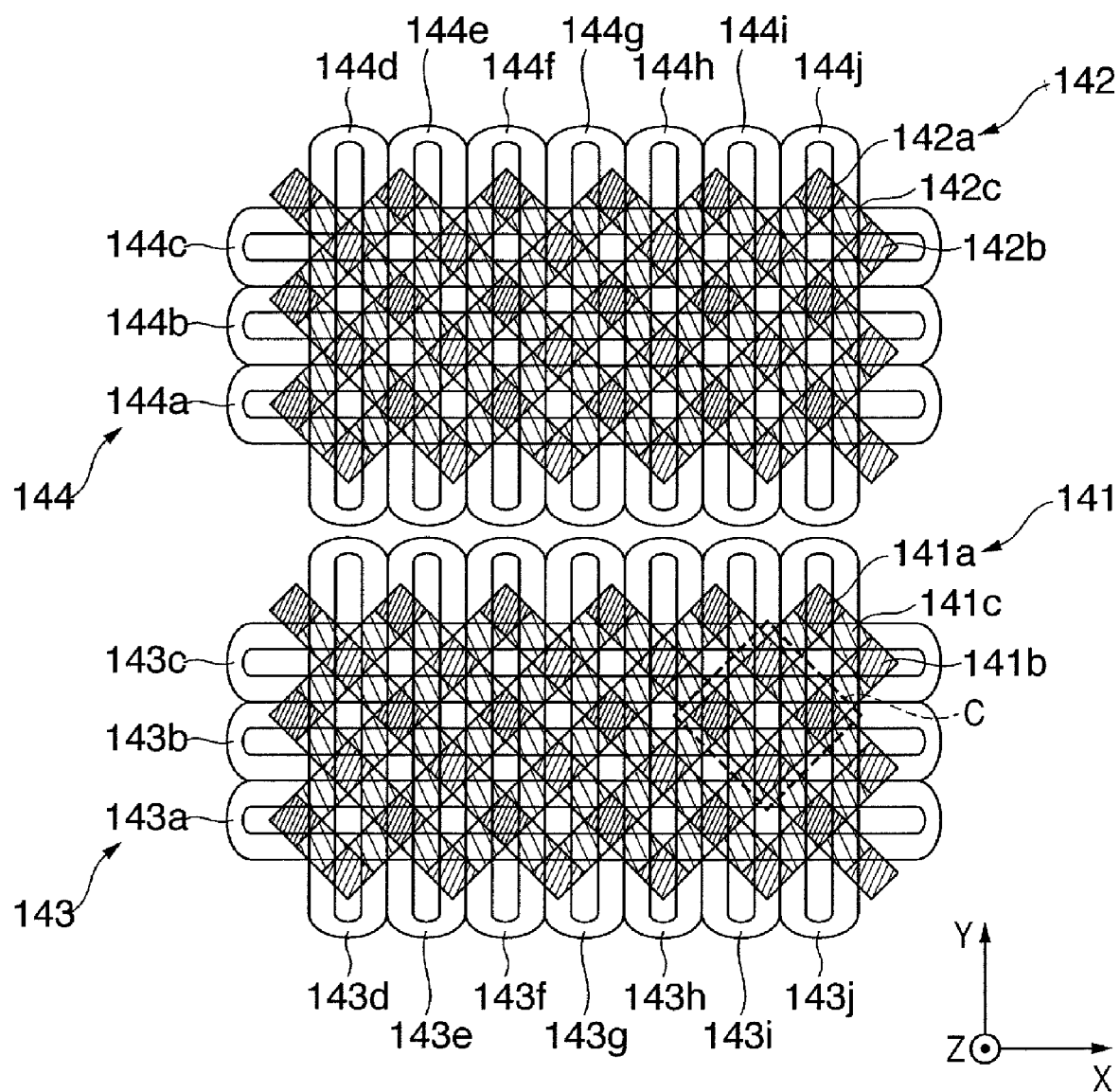
FIG. 8 is a perspective view when movable magnet units and coil units are seen from the +Z direction.

FIG. 8 is a perspective view when the movable magnet units and coil units are seen through from the +Z direction. respect to the X- and Y-axes in the X-Y plane. That Both of movable magnet unit 141 extends in a matrix in directions having angles of 45° and 135° with respect to the X- and Y-axes in the X-Y plane. That is, each of the movable magnet units 141 and 142 has a flat portion, which is in contact with the fine moving stage 110.

Referring to FIG. 8, each of the movable magnet units 141, 142 has all of black portions 141a, 142a, deep gray portions 141b, 142b, and light gray portions 141c, 142c, respectively.

The black portions 141a and 142a and deep gray portions 141b and 142b indicate magnets (main pole magnets) magnetized in the vertical direction (Z direction). The light gray portions 141c and 142c indicates a magnet (auxiliary pole magnet) magnetized in the horizontal direction. This arrangement is called a known Halbach array, and a detailed description thereof will be omitted.

Each of the coil units 143 and 144 is arranged to oppose each of the movable magnet units 141 and 142, respectively. That is, each of the coil units 143 and 144 has a flat portion, which is in contact with the coarse moving stage 120. The coil unit 143, includes coils 143a, 143b, and 143c, elongated in the X direction, and coils 143d, 143e, and 143f, 143g, 143h, 143i and 143j elongated in the Y direction. The coil unit 144 includes coils 144a, 144b and 144c, elongated in the X direction, and coils 144d, 144e, and 144f, 144g, 144h, 144i and 144j elongated in the Y direction.

Each of the relationship between a magnetic flux generated by the movable magnet unit 141 and the coils 143a, 143b, and 143c elongated in the X direction, and the relationship between a magnet flux generated by the movable magnet unit 142 and the coils 144a, 144b, and 144c elongated in the X direction is the same as that between the first magnet unit and the first coil unit according to the first exemplary embodiment. Each of the relationship between a magnetic flux generated by the movable magnet unit 141 and the coils 143d, 143e, 143f, 143g, 143h, 143i and 143j elongated in the Y direction, and the relationship between a magnetic flux generated by the movable magnet unit 142 and the coils 144d, 144e, 144f, 144g, 144h, 144i and 144j elongated in the Y direction is the same as that between the first magnet unit and the first coil unit according to the first exemplary embodiment. That is, the movable magnet unit 141 and coil unit 143 can be said to be a combination of the first linear motor unit 41 and the second linear motor unit 42. The movable magnet unit 142 and the coil unit 144 can be said to be the combination of the third linear motor unit 43 and the fourth linear motor unit 44.

For example, when an in-phase current is supplied to coils 143d and 143h and a current having a phase opposite to the in-phase is supplied to coils 143f, and 143j, one can produce a driving force (electromagnetic force) in the +Z direction or −Z direction as a whole. When an in-phase current is supplied to coils 143e and 143i, and a current having a phase opposite to the in-phase is supplied to a coil 143g, one can produce a driving force in the +X direction or −X direction as a whole. When each of currents opposite in phase to each other is supplied to each of the corresponding coils 143a and 143c, respectively, one can produce a driving force in the +Z direction or −Z direction as a whole. When a current is supplied to the coil 143b, one can produce a driving force in the +Y direction or −Y direction.

The movable magnet unit 142 and coil unit 144 are the same as the movable magnet unit 141 and coil unit 143. That is, when an in-phase current is supplied to coils 144d and 144h, and a current having a phase opposite to the in-phase is supplied to coils 144f and 144j, one can produce a driving force in the +Z direction or −Z direction as a whole. When an in-phase current is supplied to coils 144e and 144i, and a current having a phase opposite to the in-phase is supplied to a coil 144g, one can produce a driving force in the +X direction or −X direction as a whole. When each of currents opposite in phase to each other is supplied to each of the corresponding coils 144a and 144c, respectively, one can produce a driving force in the +Z direction or −Z direction as a whole. When a current is supplied to a coil 144b, one can produce a driving force in the +Y direction or −Y direction.

That is, supplying currents to the coils 143e, 143g, 143i, 144e, 144g, and 144i one can produce driving forces in the X direction. Supplying currents to the coils 143b and 144b one can produce driving forces in the Y direction. Supplying currents to the coils 143a, 143c, 143d, 143f, 143h, 143j, 144a, 144c, 144d, 144f, 144h, and 144j one can produce driving forces in the Z direction. Only some of the coils 143a, 143c, 143d, 143f, 143h, 143j, 144a, 144c, 144d, 144f, 144h, and 144j can be used to produce driving forces in the Z direction. In at least one exemplary embodiment, however, all the coils are used to suppress the influence of heat generated by the coils.

A driving force in the θx direction is produced by the difference between the sum of the driving forces in the Z direction by the coils 143a and 143c and the sum of the driving forces in the Z direction by the coils 144a and 144c. A driving force in the θy direction is produced by the difference between the sum of the driving forces in the Z direction by the coils 143d, 143f, 144d, and 144f and the sum of the driving forces in the Z direction by the coils 143h, 143j, 144h, and 144j. A driving force in the θz direction is produced by the difference between the sum of the driving forces in the X direction by the coils 143e, 143g, and 143i and the sum of the driving forces in the X direction by the coils 144e, 144g, and 144i.

In this manner, the first actuator unit 140 generates driving forces in the six-axis directions, i.e., X direction, Y direction, Z direction, θx direction, θy direction, and θz direction.

The cooling jacket 145 is provided to cover the coil units 143 and 144. A cooling medium such as a refrigerant is supplied from a refrigerant pipe into the cooling jacket 145 through couplings (not shown). The cooling medium cools the coil units 143 and 144 to be able to prevent heat generated by the coil units 143 and 144 from being transferred to the fine moving stage 110. This reduces the deformation of the fine moving stage 110 due to its thermal expansion. The deformation of the fine moving stage changes the relative distance between the position of the reflecting mirror for measuring the position of the fine moving stage and the position of the wafer on the stage to result in degradation in exposure accuracy. Still worse, the deformation of the fine moving stage changes the wafer surface shape to result in further degradation in exposure accuracy.

In at least one exemplary embodiment, one cooling jacket 145 accommodates the coil units 143 and 144. This one can decrease the number of couplings of the cooling medium pipe to attain weight reduction and simplification of the coarse moving stage 120. In at least one exemplary embodiment, the cooling jacket 145 is made of a non-magnetic substance to prevent any eddy current due to a magnetic field formed by the current flowing through the coil. For example, a ceramic or resin material is available as the material of the cooling jacket 145.

A weight compensation unit (not shown) using a permanent magnet supports the weight of the fine moving stage 110 by generating a force in the Z direction. The first actuator unit 140 need not generate a large force to support the fine moving stage 110.

Figure 7:
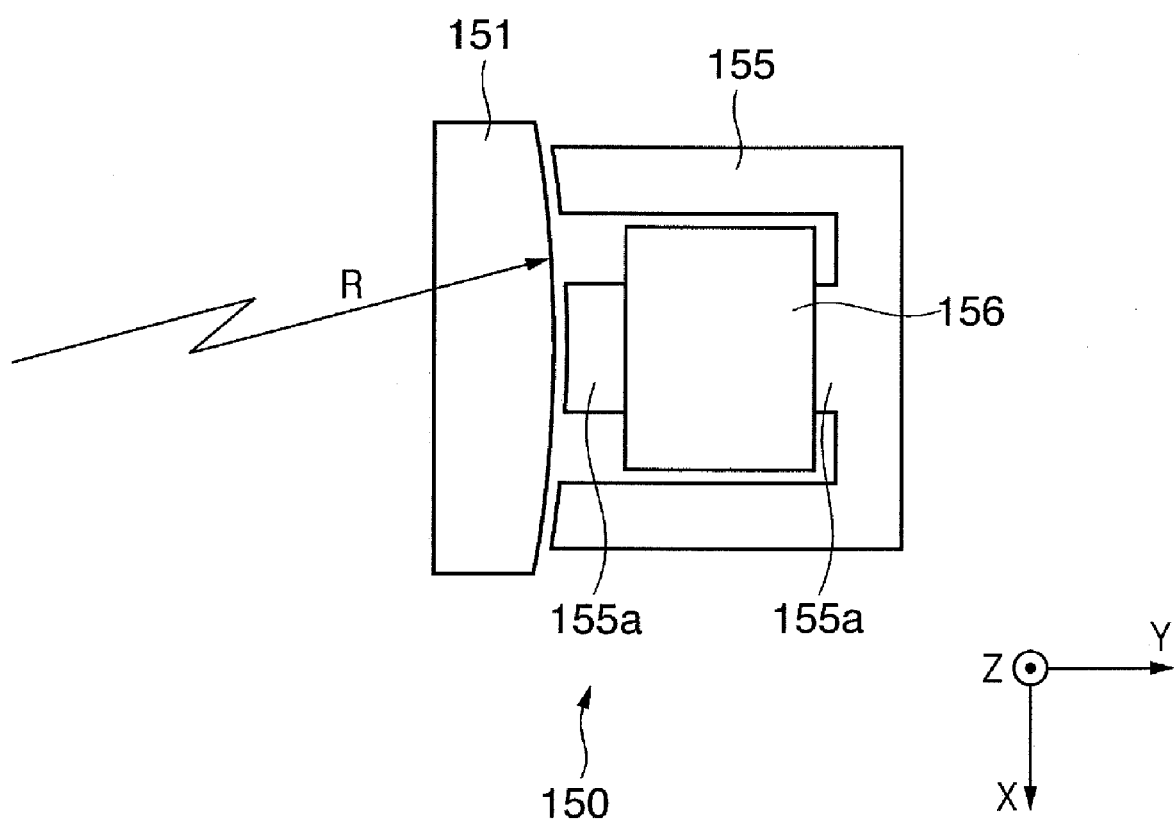
FIG. 7 is a view when an electromagnetic coupling unit is seen from the +Z direction.

FIG. 7 is a view when an electromagnetic coupling unit is seen from the +Z direction.

The second actuator unit 150 includes four electromagnetic coupling units (see FIG. 6). Each electromagnetic coupling unit includes an electromagnet I core 151, 152, 153, 154, electromagnet E core 155, and electromagnetic coil unit 156.

The electromagnet I core 151 has an almost I shape when seen from the +Z direction. The electromagnet I core 151 extends along the side portion of the stage lower plate 113 of the fine moving stage 110 (see FIGS. 5 and 6).

The electromagnet E core 155 has an almost E shape when seen from the +Z direction. In the electromagnet attachment table 122 of the coarse moving stage 120, the electromagnet E core 155 is provided at a position opposing the side portion of the stage lower plate 113 of the fine moving stage 110 (see FIG. 5).

To suppress core losses, the electromagnet I core 151 and electromagnet E core 155 can be formed by stacking silicon steel thin plates. For example, the interval between the electromagnet I core 151 and the electromagnet E core 155 can be around 100 μm. The fine moving stage 110 need be driven in the θz direction to direct the wafer toward exposure light. The portion of the electromagnet I core 151, which opposes the electromagnet E core 155 can be a cylindrical surface so as not to change the interval between the electromagnet I core 151 and the electromagnet E core 155 even when the fine moving stage 110 rotates in the θz direction. In at least one exemplary embodiment, the curvature radius of the cylindrical surface matches a distance R from the center of the wafer. Similarly, the surface of the electromagnet E core 155, which opposes the electromagnet I core 151 can be formed such that the interval between the electromagnet I core 151 and the electromagnet E core 155 becomes constant.

The electromagnetic coil unit 156 is wound around a middle projecting portion 155a of the electromagnet E core 155. The electromagnetic coil unit 156 incorporates a driving coil and search coil.

Each electromagnetic coupling unit can transmit a magnetic attraction force in only one direction. Therefore, four electromagnetic coupling units are prepared to correspond to the +X direction, −X direction, +Y direction, and −Y direction.

When a current flows through the electromagnetic coil unit 156 in each electromagnetic coupling unit, a magnetic attraction force acts between the electromagnet I core 151 and the electromagnet E core 155. The acceleration/deceleration force of the coarse moving stage 120 is transmitted to the fine moving stage 110 through the electromagnetic coupling unit. For weight reduction of the fine moving stage, a mechanism for transmitting the acceleration/deceleration force of the coarse moving stage is desirably small. Using the above-described electromagnetic coupling unit one can decrease the calorific value as compared with a small-sized linear motor.

A magnetic attraction force is generated by the electromagnetic coupling unit upon being feedback-controlled such that the force coincides with the acceleration curve of the stage. Shortening of the alignment time of the fine moving stage 110 requires this feedforward control with high accuracy. Control of the electromagnetic coupling unit uses a known magnetic flux feedback control system as well.

The search coil incorporated in the electromagnetic coil unit 156 detects a temporal change in magnetic flux as a function of the magnetic attraction force. Integrating the output value of the search coil over time one can obtain a magnetic flux signal.

Since the magnetic attraction force is proportional to the square of the magnetic flux, a magnetic flux command to the magnetic flux feedback control system uses the value of the square root of the acceleration curve. The control system multiplies the gain by a magnetic flux error as the difference between the magnetic flux command and the magnetic flux signal detected by the search coil, and issues a command to the driving coil driver. Consequently, the magnetic attraction force generated by the electromagnetic coupling unit coincides with the acceleration curve of the stage.

In this manner, the second actuator unit 150 can transmit the acceleration/deceleration force of the coarse moving stage 120 to the fine moving stage 110. The first actuator unit 140 need only generate a Lorentz force having a magnitude required for canceling disturbance in non-acceleration /deceleration and an error of the acceleration/deceleration force due to the magnetic attraction force generated by the second actuator unit 150. By reason of this, one can suppress to the extent of small amount the Lorentz force generated by the first actuator unit 140. It is also possible to suppress heat generation by the coil units 143 and 144.

The position, in the Z direction, of the thrust generated by the electromagnetic coupling unit desirably coincides with the position, in the Z direction, of the barycenter of the fine moving stage. This is because a shift in this positional relationship causes disturbance which acts on the fine moving stage in the pitching direction when the electromagnetic coupling unit generates a thrust. The first actuator unit must cancel such disturbance. This requires much time to align the fine moving stage and increases the calorific value. However, design limitation is imposed on an operation for matching the electromagnet I core with the position, in the Z direction, of the barycenter of the fine moving stage.

Figure 9:
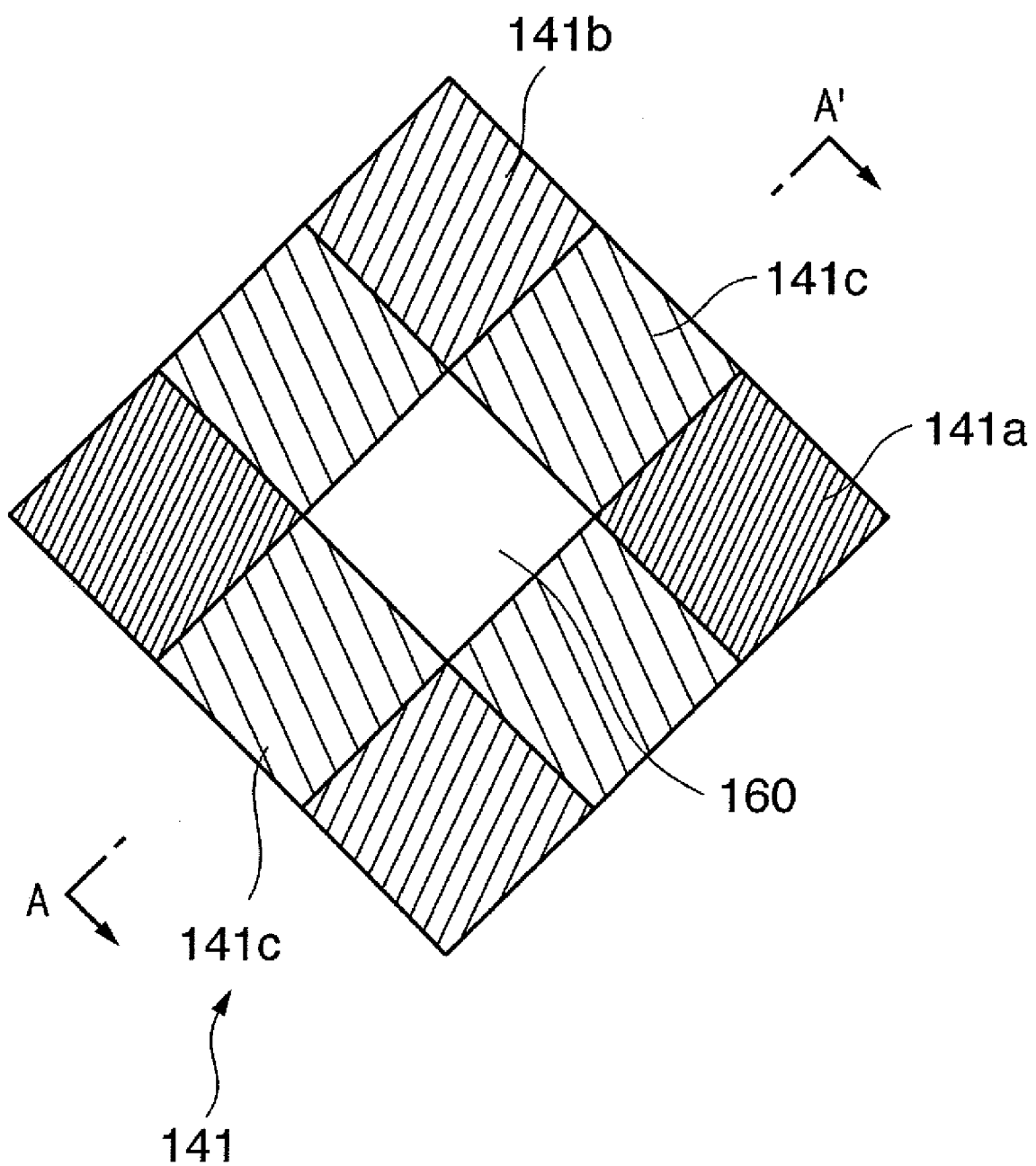
FIG. 9 is an enlarged view showing a portion surrounded by a broken line in FIG. 8.
Figure 10:
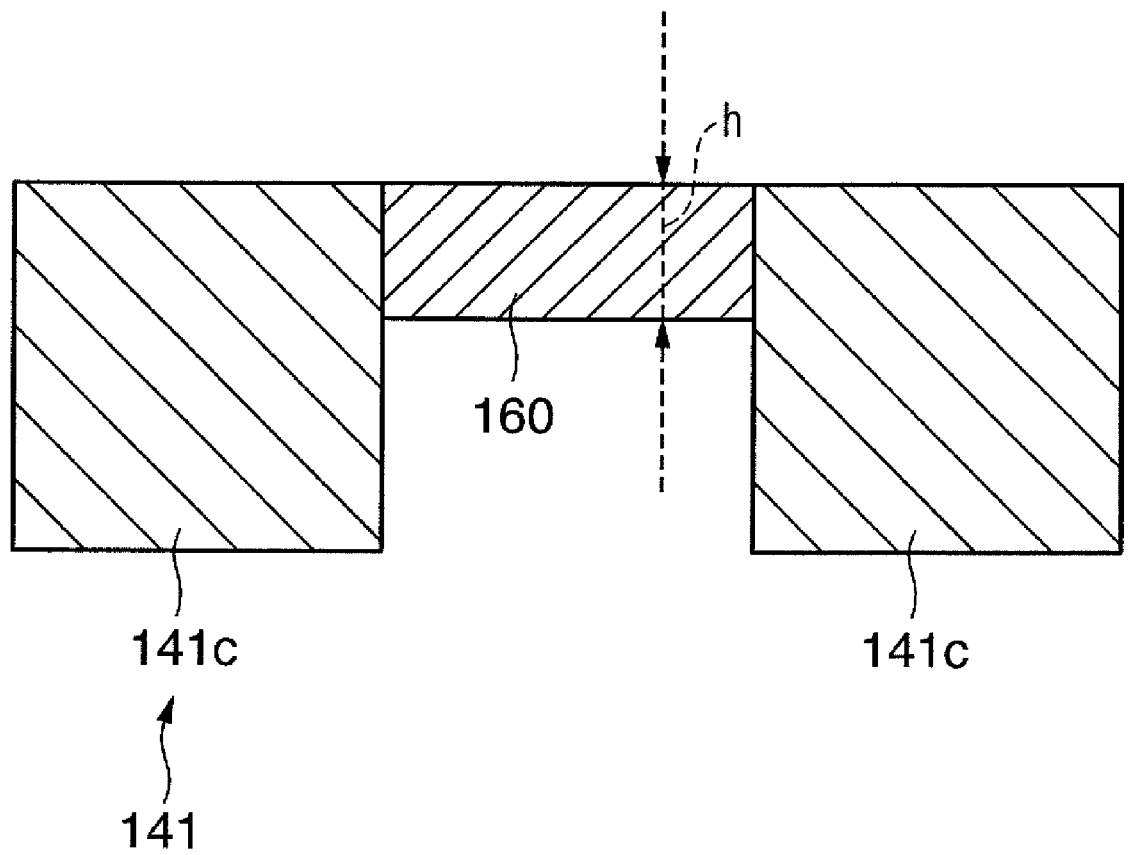
FIG. 10 is a sectional view taken along a line A-A' in FIG. 9.

In view of this, according to a modification to the second exemplary embodiment to be described later, a weight is inserted in an area where no magnet of the movable magnet unit exists so as to adjust the position, in the Z direction, of the barycenter of the fine moving stage. A wafer stage apparatus according to a modification to the second exemplary embodiment will be explained with reference to FIGS. 9 and 10. FIG. 9 is an enlarged view showing a portion surrounded by a broken line in FIG. 8. FIG. 10 is a sectional view taken along a line A-A' in FIG. 9. Constituent parts different from those in the second exemplary embodiment will be mainly explained, and a description of the same constituent parts will be omitted.

As shown in FIG. 9, a weight 160 is inserted in an area surrounded by the black portions 141a, deep gray portions 141b, and light gray portions 141c in the movable magnet unit 141. As shown in FIG. 10, the mass of the weight 160 is adjusted by controlling its dimension h in the Z direction. The weight 160 can be made of a non-magnetic substance so as not to influence the magnetic flux generated by the movable magnet unit 141 or 142.

In this manner, inserting the weight 160 in the gap among the magnets of the movable magnet unit 141 or 142 one can shift the barycentric position of the fine moving stage 110 in the vertically downward direction (−Z direction). In this case, inserting the weight in a dead space where no magnet exists one can adjust the barycentric position of the fine moving stage free from any design limitation.

Although the position, in the Z direction, of the barycenter of the fine moving stage is adjusted in the above description, it is also possible to adjust the positions in the X and Y directions. That is, the thrust position, in the Y direction, of the electromagnetic coupling unit which generates a thrust in the X direction can be made to coincide with the position, in the Y direction, of the barycenter of the fine moving stage. Similarly, the thrust position, in the X direction, of the electromagnetic coupling unit which generates a thrust in the Y direction can be made to coincide with the position, in the X direction, of the barycenter of the fine moving stage. A shift between the thrust position and the barycentric position both for the X and Y directions can cause disturbance in the yawing direction.

A wafer stage apparatus according to the third exemplary embodiment of the present invention will be described next with reference to FIGS. 11 to 13. Constituent parts different from those in the first and second exemplary embodiments will be mainly explained, and a description of the same constituent parts will be omitted.

Figure 11:
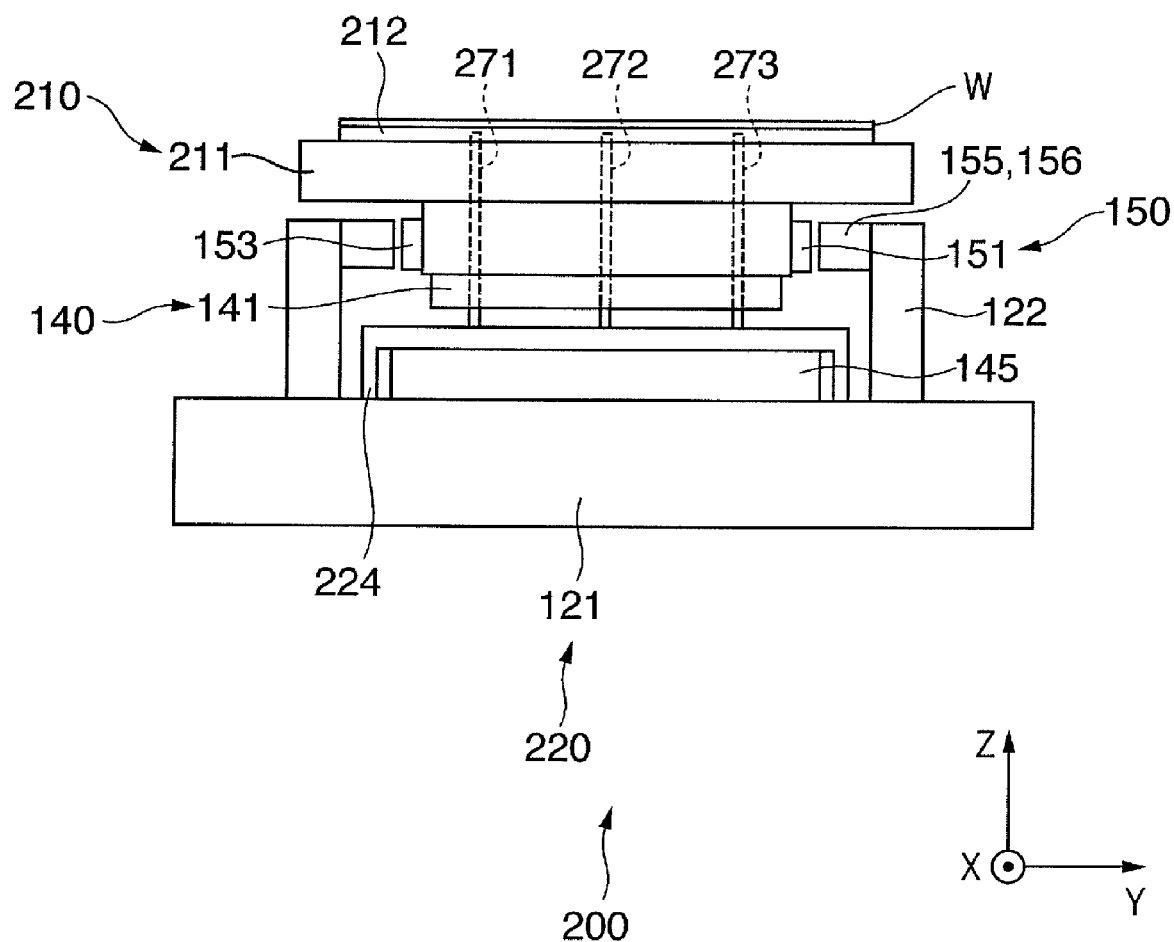
FIG. 11 is a view when a wafer stage apparatus according to the third exemplary embodiment of the present invention is seen from the +X direction.
Figure 13:
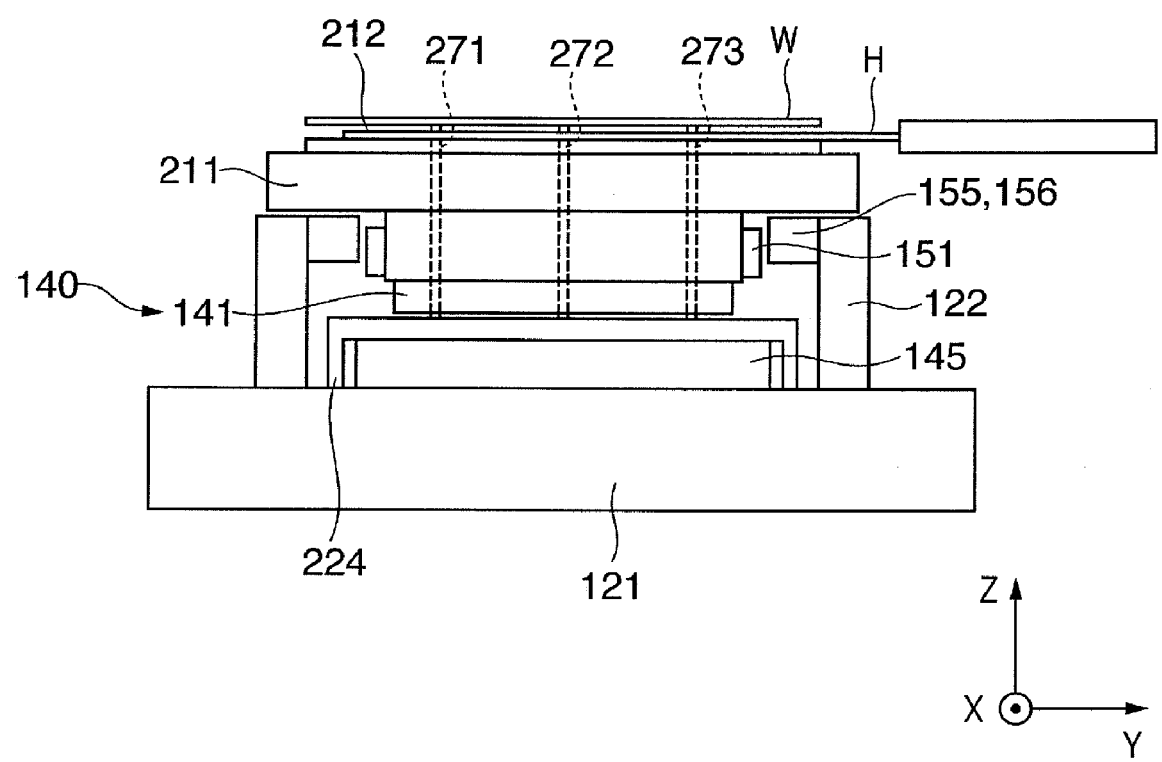
FIG. 13 is a view when the wafer stage apparatus according to the third exemplary embodiment of the present invention is seen from the +X direction.

FIGS. 11 and 13 are views when a wafer stage apparatus is seen from the +X direction. FIG. 11 shows the state in which the wafer is chucked by suction. FIG. 13 shows the state immediately before wafer exchange.

A wafer stage apparatus (alignment apparatus) 200 comprises a fine moving stage (structural object) 210 in place of the fine moving stage 10, and a coarse moving stage (moving member) 220 in place of the coarse moving stage 20. The wafer stage apparatus 200 also comprises wafer exchange support pins 271, 272, and 273.

The coarse moving stage 220 also includes a wafer exchange support pin attachment table 224. The wafer exchange support pin attachment table 224 is attached to a coarse moving stage main body 121 and arranged to straddle a cooling jacket 145.

A wafer W is set on a wafer chuck 212 of the fine moving stage 210. Through holes are formed in gaps (portions where no permanent magnets are arranged) of movable magnet units 141 and 142. Through holes (holes to pass through) are formed in a stage lower plate 113, a top plate 211, and the wafer chuck 212 of the fine moving stage 210. In at least one exemplary embodiment, the above-described weight is not inserted at the position of the through hole.

The wafer exchange support pins (support members) 271, 272, and 273 extend upward from the wafer exchange support pin attachment table 224. Via the through holes, the wafer exchange support pins 271, 272, and 273 pass through the movable magnet units 141 and 142 and fine moving stage 210 up to the vicinity of the lower surface of the wafer (alignment target) W. The wafer exchange support pins 271, 272, and 273 have a cylindrical shape to be able to evacuate their interiors.

In the state shown in FIG. 11, the wafer exchange support pins 271, 272, and 273 are not in contact with the wafer W. The wafer chuck 212 chucks the wafer W by vacuum suction.

A wafer exchange operation will be explained with reference to FIG. 13. To exchange the wafer W, vacuum suction of the wafer chuck 212 is canceled. The wafer exchange support pins 271, 272, and 273 come into contact with the lower surface of the wafer W to evacuate their interiors. The wafer exchange support pins 271, 272, and 273 chuck the wafer W by vacuum suction. As the fine moving stage 210 moves in the −Z direction, a gap is formed between the wafer W and the wafer chuck 212. A wafer exchange hand H is inserted in this gap from the −Y direction, comes into contact with the lower surface of the wafer W, and chucks the wafer W by vacuum suction as well. When vacuum suction of the wafer exchange support pins 271, 272, and 273 is canceled, the wafer exchange hand H can transport the wafer W. The wafer exchange hand H transports the wafer W to a wafer recovery system.

When a wafer W is newly loaded on the fine moving stage 210, an operation opposite to the wafer exchange operation is done.

Figure 12:
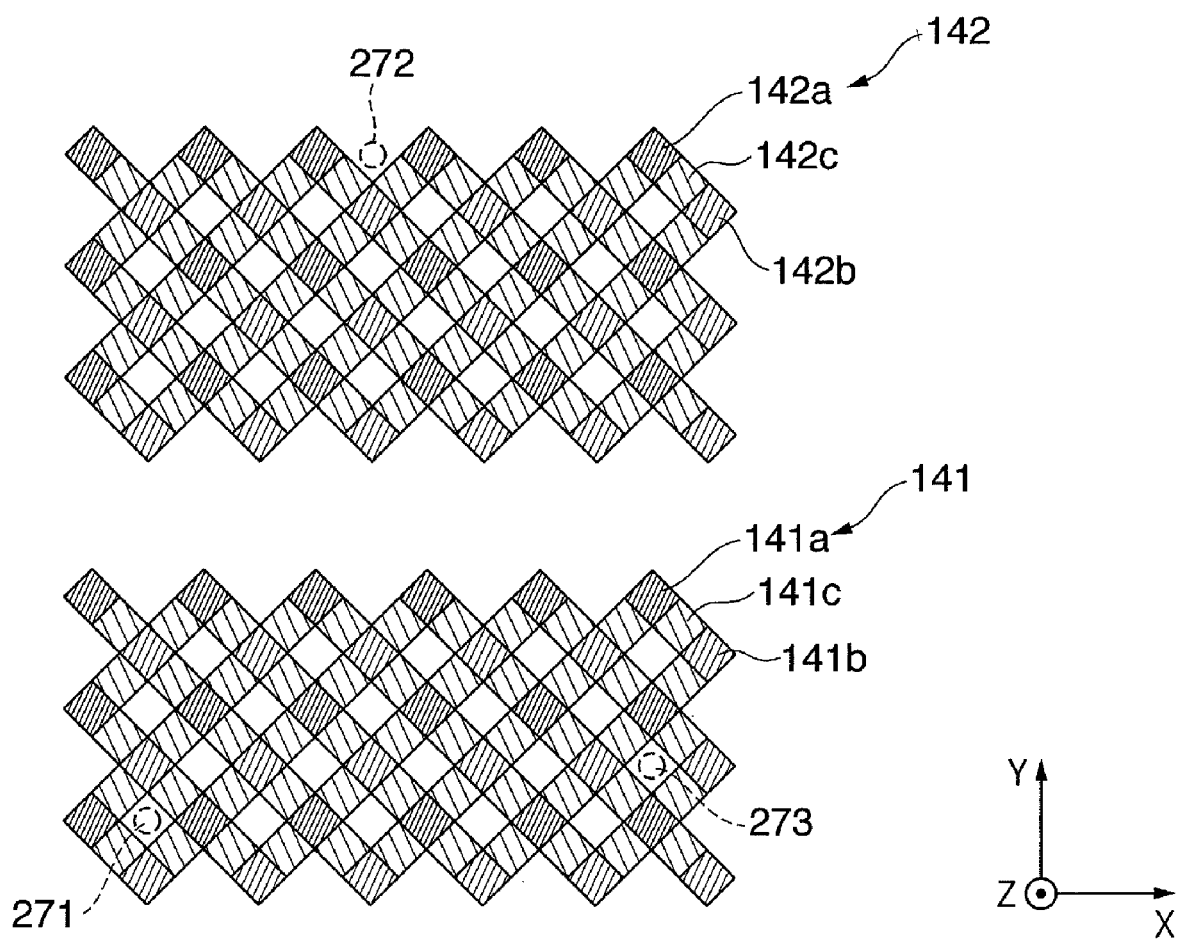
FIG. 12 is a view when movable magnet units are seen from the +Z direction.

FIG. 12 is a view when the movable magnet units 141 and 142 are seen from the +Z direction. For example, the wafer exchange support pins 271, 272, and 273 pass through triangular positions in the X-Y plane as indicated by broken lines in FIG. 12. More specifically, the wafer exchange support pins 271, 272, and 273 pass through the gaps (portions where no permanent magnets are arranged) of the movable magnet units 141 and 142. The arrangement of the wafer exchange support pin can be changed as needed as long as it is located in the gap of the movable magnet unit.

When the diameters of the wafer exchange support pins 271, 272, and 273 are larger than the lengths of the gaps of the movable magnet unit 141 and 142, the wafer exchange support pins 271, 272, and 273 can pass between the movable magnet units 141 and 142. Alternatively, the wafer exchange support pins 271, 272, and 273 can pass outside the movable magnet units 141 and 142.

The thrust constant of the above-described linear motor unit (first actuator unit) changes depending on the distance between the magnet unit and the coil unit. The thrust constant is represented by a thrust when a current of 1A is supplied to a coil. In the following exemplary embodiment, a method of supplying a compensation current to a coil to reduce the influence of a change in thrust constant will be explained.

A wafer stage apparatus according to the fourth exemplary embodiment of the present invention will be described next with reference to FIGS. 14 to 16. Constituent parts different from those in the first, second, and third exemplary embodiments will be mainly explained, and a description of the same constituent parts will be omitted.

Figure 14:
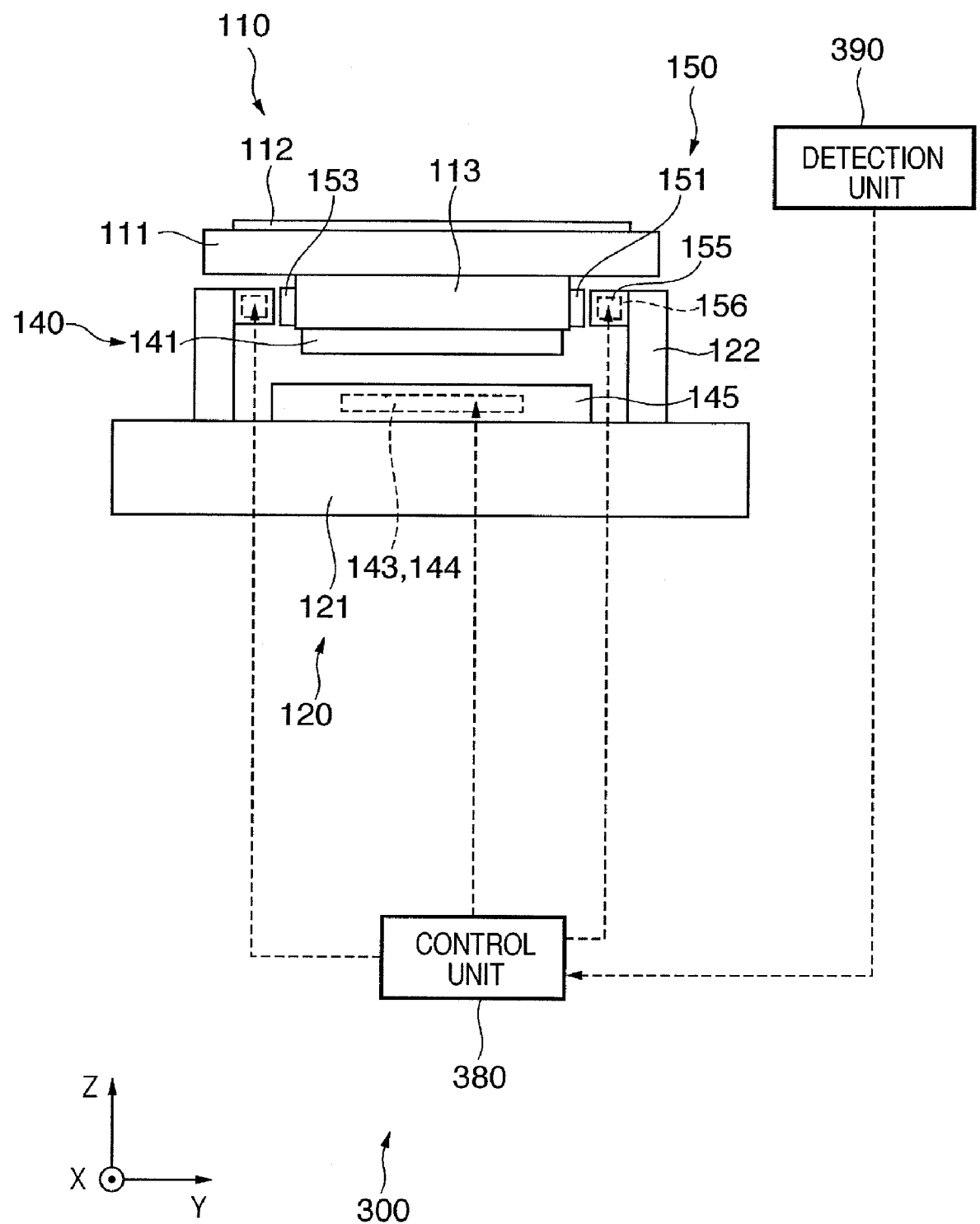
FIG. 14 is a view when a wafer stage apparatus according to the fourth exemplary embodiment of the present invention is seen from the +X direction.

FIG. 14 is a view showing the arrangement of a wafer stage apparatus.

A wafer stage apparatus (alignment apparatus) 300 also comprises a control unit 380 and detection unit 390.

The detection unit 390 can adopt the position measurement system of the fine moving stage described in the first exemplary embodiment. The detection unit 390 electrically connects to the control unit 380.

The control unit 380 electrically connects to an electromagnetic coil unit 156 and coil units 143 and 144 (to be referred to as control targets hereinafter), and the detection unit 390.

The detection unit 390 sends the detected position information of a fine moving stage 110 to the control unit 380. The control unit 380 controls the control targets on the basis of the position information. With this operation, required currents are supplied to the control targets to execute alignment control for the fine moving stage.

Figure 15:
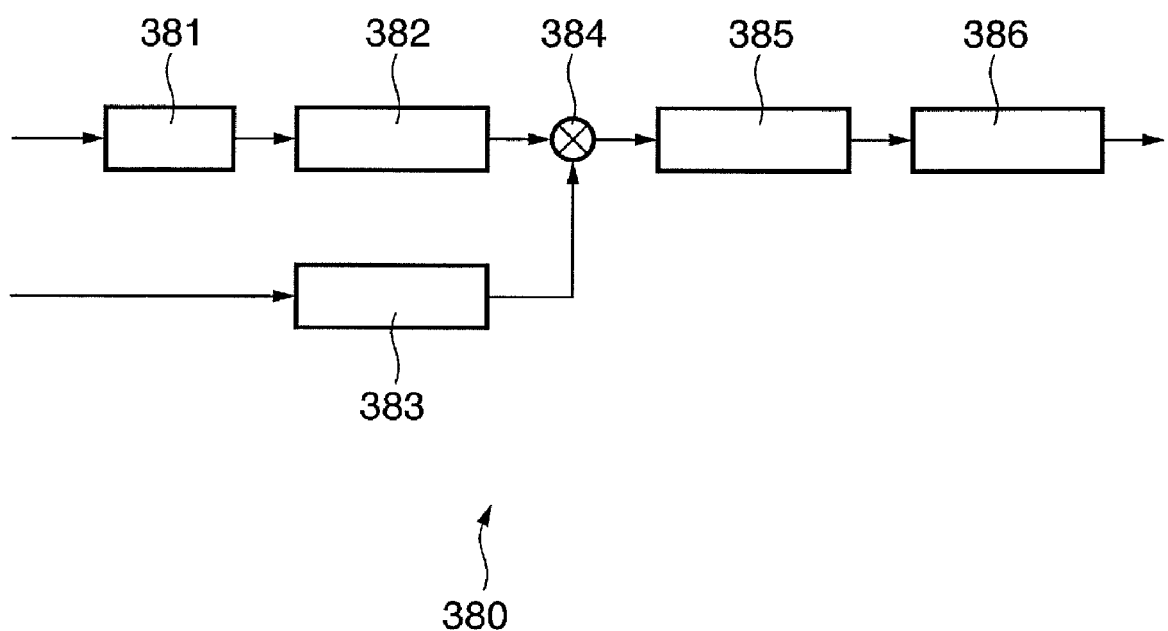
FIG. 15 is a block diagram showing the arrangement of a control unit.

FIG. 15 is a block diagram showing the arrangement of the control unit. The control unit 380 includes a control system 381, command operation processor 382, correction operation processor 383, multiplier 384, D/A converter 385, and current driver 386.

The control system 381 receives position information from the detection unit 390. The control system 381 generates deviation information as the difference between the position command and the position information. The control system 381 arithmetically processes a control command corresponding to a control force using the resultant deviation information. The control command in this case is associated with the X direction, Y direction, Z direction, θx direction, θy direction, and θz direction. The control system 381 sends the control command to the command operation processor 382.

On the basis of the control command, the command operation processor 382 calculates information (digital information) about currents to be supplied to the control targets. The command operation processor 382 sends the current information to the multiplier 384.

The correction operation processor 383 receives the position information of the fine moving stage in the Z direction from the detection unit 390. The correction operation processor 383 calculates a correction coefficient on the basis of thrust constant information (see FIG. 16) and the position information. The thrust constant information is information indicating the relationship between the thrust constant and the relative position. The thrust constant is a constant representing a driving force when a current of 1A is supplied to a coil.

The relative position represents the position of a coarse moving stage 120 relative to the fine moving stage 110. If the coarse moving stage does not drive in the Z direction like the fourth exemplary embodiment, its position measurement is not always necessary. The correction operation processor 383 sends the correction coefficient information to the multiplier 384.

The multiplier 384 multiplies the correction coefficient by the current value indicated by the current information to generate corrected current information. The multiplier 384 sends the corrected current information (digital information) to the D/A converter 385.

The D/A converter 385 converts the corrected current information (digital information) into current information (analog information). The D/A converter 385 sends the current information (analog information) to the current driver 386.

Figure 16:
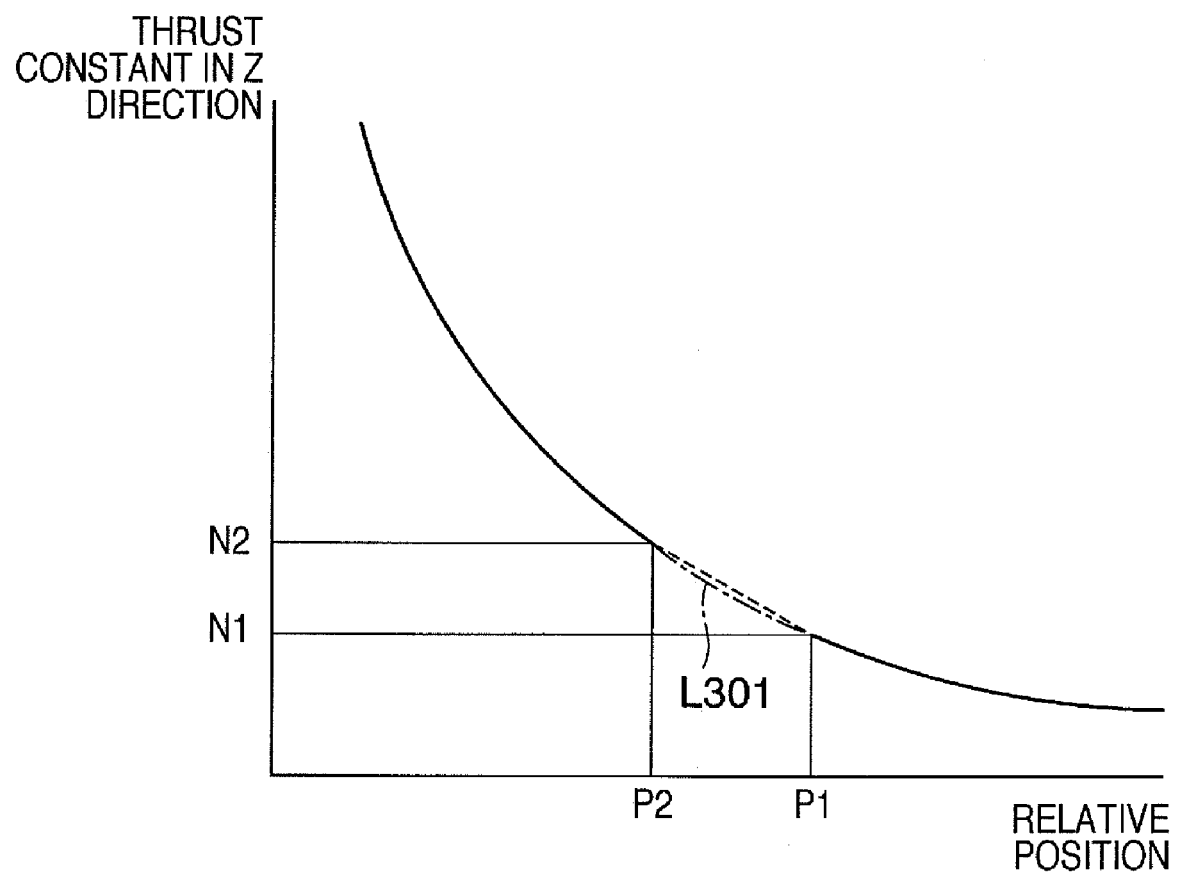
FIG. 16 is a conceptual graph showing thrust constant information.

FIG. 16 is a graph showing thrust constant information. The thrust constant information indicates the relationship between the thrust constant and the relative position. The thrust constant represents a constant representing a driving force when a current of 1A is supplied to a coil. The relative position represents the position of the coarse moving stage 120 relative to the fine moving stage 110, and corresponds to the distance between the magnet unit and the coil unit.

Referring to FIG. 16, the ordinate represents the thrust constant in the Z direction, and the abscissa represents the relative position. For example, the relative position changes as the interval between a movable magnet unit 141 and the coil unit 143 changes. This changes the thrust constant received by the movable magnet unit 141 from the coil unit 143. Letting N1 be the thrust constant in the Z direction at the exposure position, the relative wafer exchange position decreases as the fine moving stage moves in the −Z direction, and the thrust constant becomes N2.

The control system of the fine moving stage generally uses a feedback loop having a very large gain to increase the controllability. As the thrust constant increases, the gain of the feedback loop equivalently increases. An excessive increase in gain can cause an oscillation phenomenon at the wafer exchange position.

In the fourth exemplary embodiment, one can correct the command current value to a coil using the thrust constant information calculated by magnetic simulation in advance. For example, the correction coefficient is set to 1.0 when the position of the fine moving stage in the Z direction corresponds to the exposure position, and set to N1/N2 when the position of the fine moving stage in the Z direction corresponds to the wafer exchange position.

A correction straight line L301 (to the position between relative position P1 and P2) approximated by a straight line as shown in FIG. 16 can be used in the area between an actual exposure position and wafer exchange position. Using this correction straight line greatly facilitates an arithmetic process by the correction operation processor.

Thrust constant information in the X direction is prepared for coils 143e, 143g, 143i, 144e, 144g, and 144i (see FIG. 8). Thrust constant information in the Y direction is prepared for coils 143b and 144b. Thrust constant information in the Z direction is prepared for coils 143a, 143c, 144a, and 144c. Thrust constant information in the Z direction is prepared for coils 143d, 143f, 143h, 143j, 144d, 144f, 144h, and 144j.

With this correction, the thrust constant apparently becomes constant even when the fine moving stage moves in the Z direction. This allows stable control with the feedback gain of the same control system. Although a method of multiplying the feedback gain of the control system by the correction coefficient is available, it requires complicated calculation of the correction coefficient. In at least one exemplary embodiment, correction of the value can occur be executed immediately before being sent to the driver exemplified here.

Figure 17:
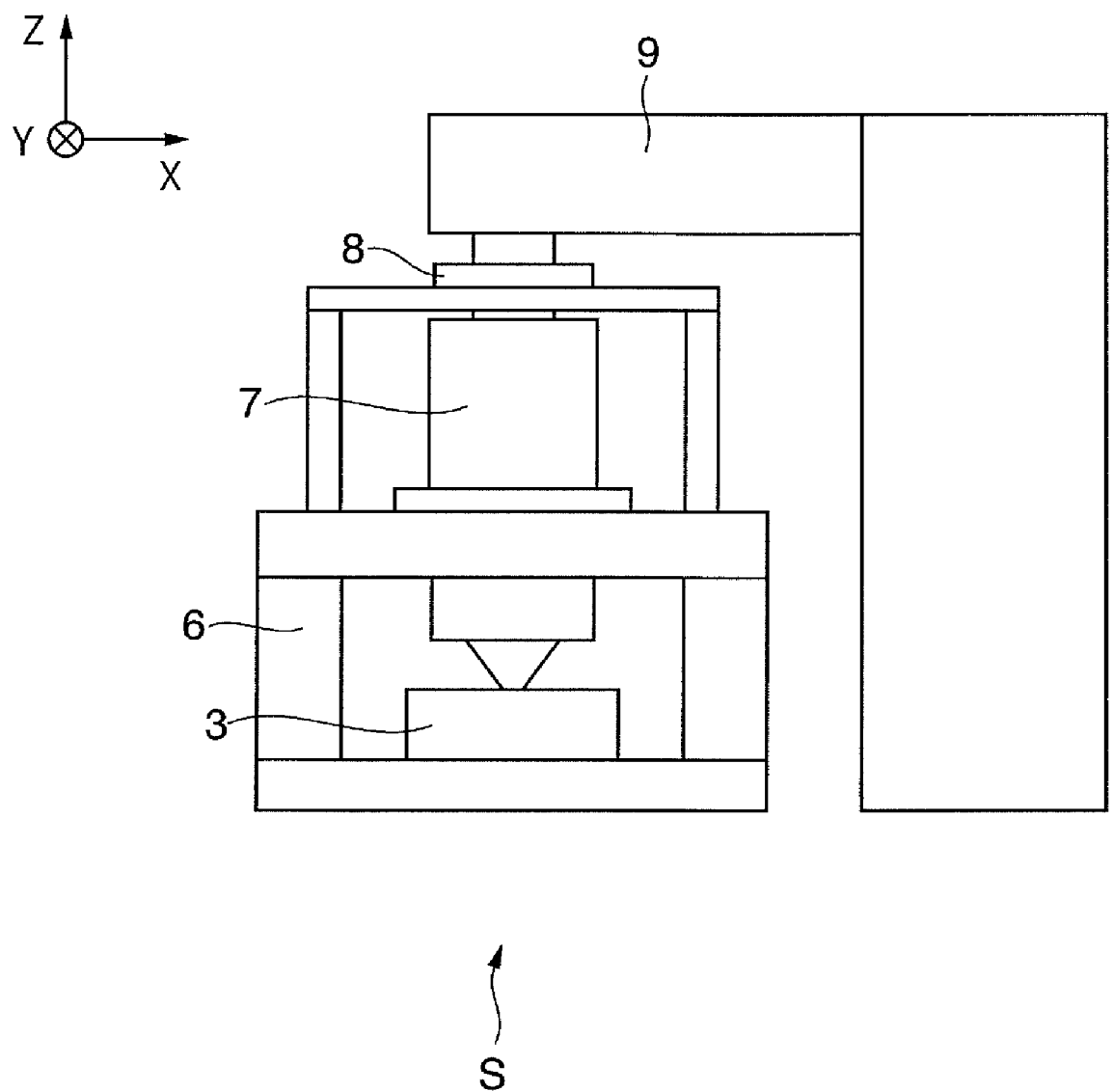
FIG. 17 is a view for explaining an exposure apparatus.

An exemplary exposure apparatus to which a wafer stage apparatus according to at least one exemplary embodiment of the present invention is applied will be explained next. As shown in FIG. 17, an exposure apparatus S comprises an illumination unit 9, a reticle stage 8 which mounts a reticle, a projection optical system 7, an exposure apparatus main body 6 which supports the projection optical system 7, and a wafer stage apparatus 3 which mounts a wafer. The exposure apparatus can project and expose the circuit pattern formed on the reticle onto the wafer. The exposure apparatus can employ the step & repeat projection exposure scheme or step & scan projection exposure scheme.

The illumination unit 9 illuminates the reticle on which the circuit pattern is formed (irradiates the reticle with exposure light), and comprises a light source unit and illumination optical system. The light source unit can use, e.g., a laser as a light source. The laser can use an ArF excimer laser with a wavelength around 193 nm, a KrF excimer laser with a wavelength around 248 nm, or an $F_2$ excimer laser with a wavelength around 153 nm. However, the type of laser is not limited to an excimer laser, and, for example, a YAG laser can be used. Also, the number of lasers is not limited. When the light source uses a laser, a light beam shaping optical system or incoherent optical system can be used. The beam shaping optical system shapes a parallel light beam from the laser light source into a desired beam shape. The incoherent optical system converts a coherent laser beam into an incoherent light beam. The light source usable in the light source unit is not limited to a laser, and one or a plurality of mercury lamps or xenon lamps are also available.

The illumination optical system is an optical system which illuminates a mask, and includes a lens, mirror, light integrator, and aperture stop.

The projection optical system 7 can use an optical system including only a plurality of lens elements, an optical system (catadioptric optical system) including a plurality of lens elements and at least one concave mirror, an optical system including a plurality of lens elements and at least one diffractive optical element such as a kinoform, or an optical system of a total reflection mirror type.

The reticle stage 8 and wafer stage apparatus 1 can move by, e.g., a linear motor. In the step & scan projection exposure scheme, these stages move in synchronism with each other. To align the pattern of the reticle on the wafer, at least one of the wafer stage and reticle stage separately comprises an actuator.

The exposure apparatus S can be used to manufacture a semiconductor device such as a semiconductor integrated circuit, a micromachine, and a device such as a thin-film magnetic head on which a micropattern is formed.

Figure 18:
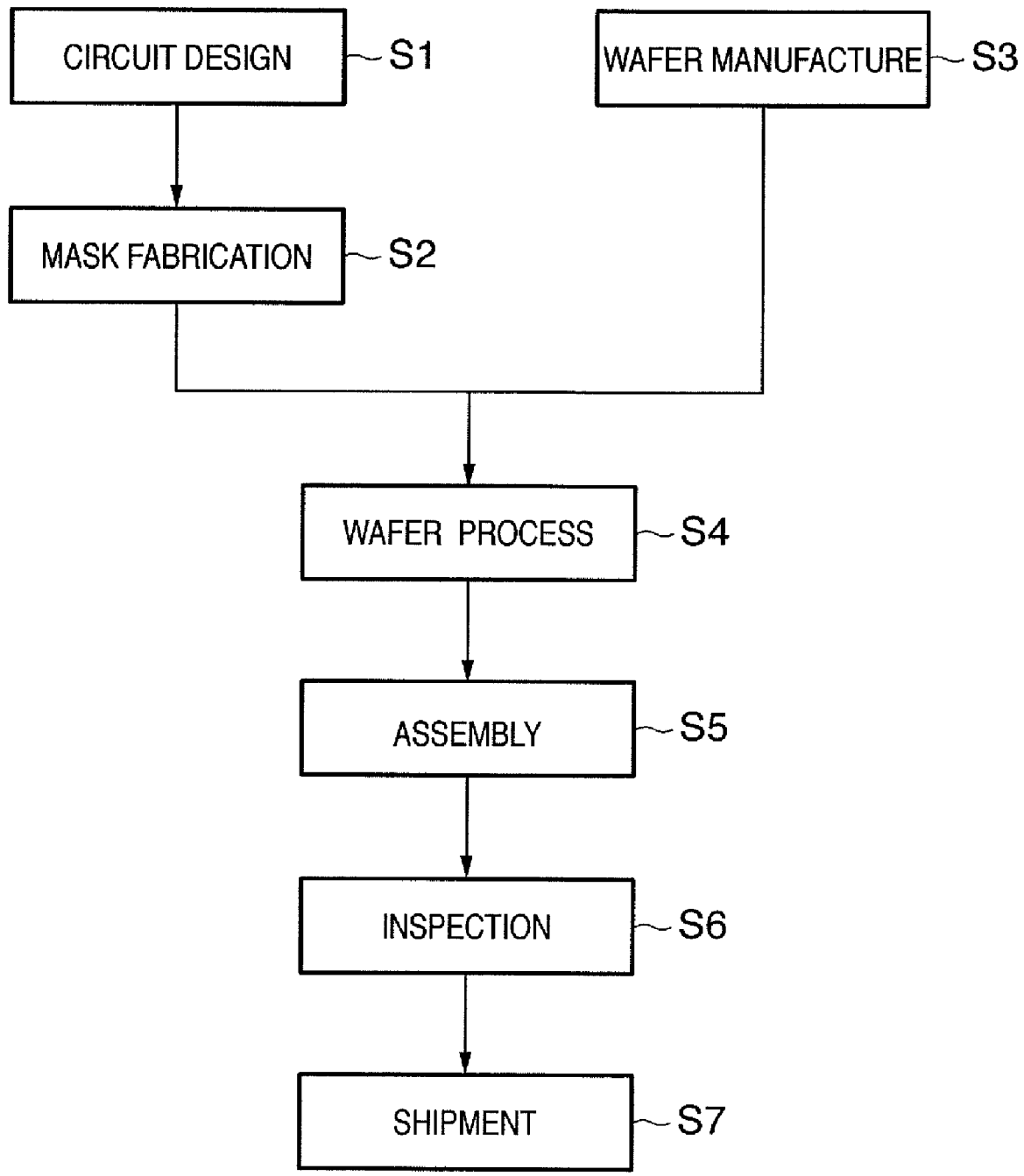
FIG. 18 is a flowchart showing the overall semiconductor device manufacturing process.
Figure 19:
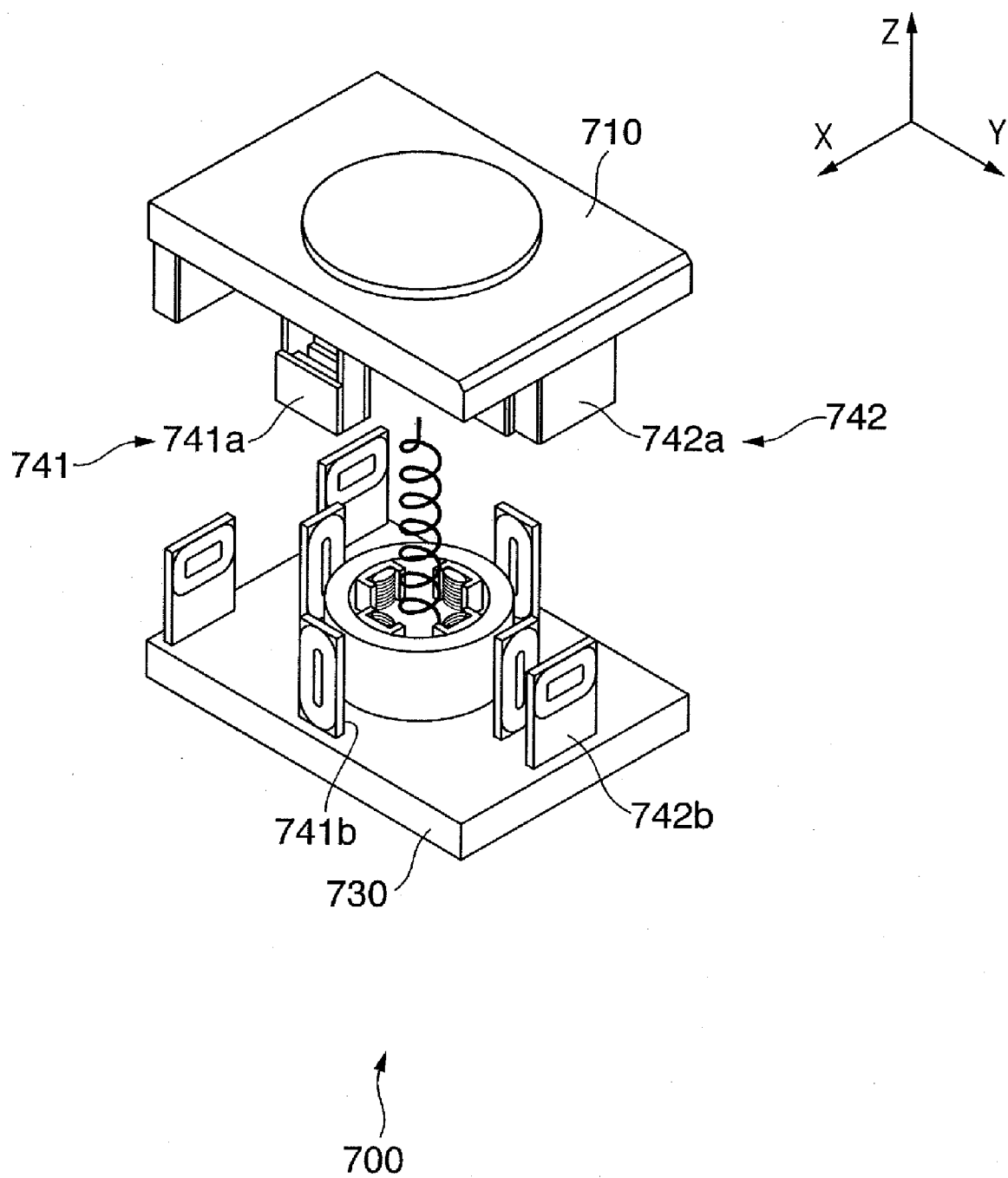
FIG. 19 is a view for explaining a prior art.
Figure 20:
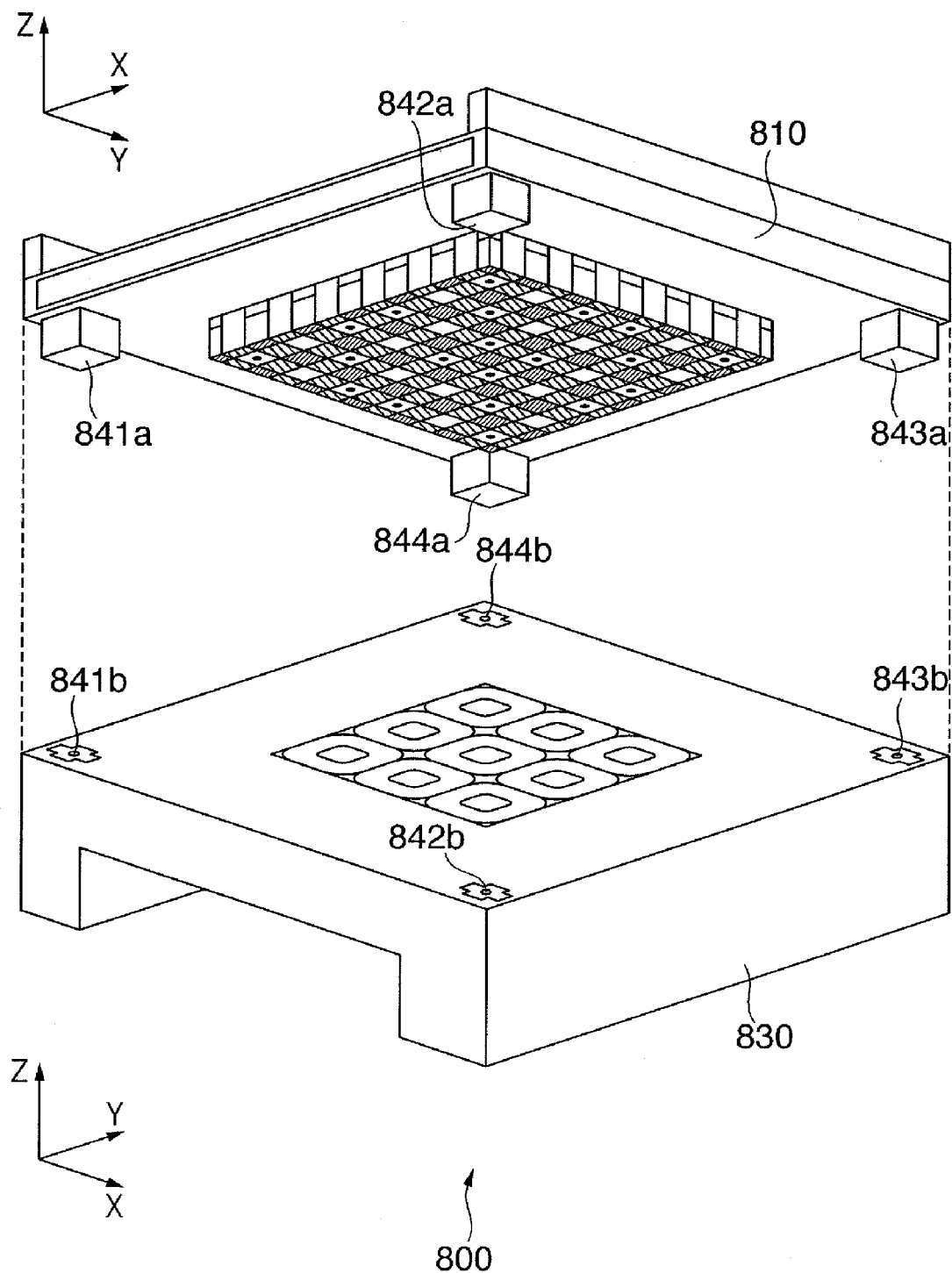
FIG. 20 is a view for explaining another prior art.

A semiconductor device manufacturing process using an exemplary exposure apparatus to which a wafer stage apparatus according to at least one exemplary embodiment of the present invention is applied will be explained next with reference to FIG. 18. FIG. 18 is a flowchart showing the overall semiconductor device manufacturing process.

In step S1 (circuit design), the circuit of a semiconductor device is designed.

In step S2 (mask fabrication), a mask (also called a master or reticle) is fabricated on the basis of the designed circuit pattern.

In step S3 (wafer manufacture), a wafer (also called a substrate) is manufactured using a material such as silicon.

In step S4 (wafer process) called a pre-process, the above-described exposure apparatus S forms an actual circuit on the wafer by lithography using the mask and wafer.

In step S5 (assembly) called a post-process, a semiconductor chip is formed using the wafer manufactured in step S4. This step includes an assembly step (dicing and bonding) and packaging step (chip encapsulation).

In step S6 (inspection), the semiconductor device manufactured in step S5 undergoes inspections such as an operation confirmation test and durability test. After these steps, the semiconductor device is completed and shipped in step S7 (shipment).

The wafer process in step S4 includes: an oxidation step of oxidizing the wafer surface; a CVD step of forming an insulating film on the wafer surface; an electrode formation step of forming an electrode on the wafer by vapor deposition; an ion implantation step of implanting ions in the wafer; a resist processing step of applying a photosensitive agent to the wafer; an exposure step (preparation step) of exposing, using the above-described exposure apparatus, the wafer having undergone the resist processing step to light via the mask pattern to form a latent image pattern on the resist; a development step of developing the wafer exposed in the exposure step; an etching step of etching portions other than the latent image pattern developed in the development step; and a resist removal step of removing any unnecessary resist remaining after etching. These steps are repeated to form multiple circuit patterns on the wafer.

While the present invention has been described with reference to exemplary embodiments, it is to be understood that the invention is not limited to the discussed exemplary embodiments. The scope of the following claims is to be accorded the broadest interpretation so as to encompass all such modifications and equivalent structures and functions.

This application claims the benefit of Japanese Patent Application No. 2006-170757, filed Jun. 20, 2006, which is hereby incorporated by reference herein in its entirety.

What is claimed is:

1. An alignment apparatus comprising:
   a stage base;
   a coarse moving stage arranged on the stage base;
   a fine moving stage arranged on the coarse moving stage;
   a moving mechanism which moves the coarse moving stage relative to the stage base; and
   an electromagnetic actuator which moves the fine moving stage relative to the coarse moving stage, the electromagnetic actuator including a plurality of linear motor units which apply forces in a horizontal direction and a vertical direction to the fine moving stage,
   wherein the plurality of linear motor units apply, to the fine moving stage, forces in a rotation direction about each of two axes orthogonal to each other in a horizontal plane and a rotation direction about an axis in the vertical direction,
   wherein each of the plurality of linear motor units includes a magnet unit in which a plurality of permanent magnets magnetized in the vertical direction align themselves in a horizontal plane and a coil unit formed by juxtaposing a plurality of coils in the horizontal direction, each of the plurality of coils including a straight portion and a curved portion, and
   wherein the electromagnetic actuator moves the fine moving stage relative to the coarse moving stage in the horizontal direction or in the rotation direction about the axis in the vertical direction such that the magnet unit always opposes the straight portion.

2. The apparatus according to claim 1, further comprising:
   a non-magnetic weight inserted between the plurality of permanent magnets.

3. The apparatus according to claim 1, further comprising:
   a support member to pick up and support an alignment target mounted on the fine moving stage,
   wherein the fine moving stage has a hole through which the support member passes and which is formed between the plurality of permanent magnets.

4. The apparatus according to claim 1, wherein
   the electromagnetic actuator includes a first element provided to the fine moving stage, and a second element provided to the coarse moving stage,
   the electromagnetic actuator adjusts a position of the fine moving stage at least in the vertical direction relative to the coarse moving stage by an electromagnetic force between the first element and the second element,
   the fine moving stage includes a surrounding area and an inner area serving as an area inside the surrounding area, and
   the first element is not arranged in the surrounding area but arranged in the inner area.

5. The apparatus according to claim 4, wherein the first element arranged in the inner area includes a flat portion which is in contact with the fine moving object.

6. The apparatus according to claim 4, wherein the second element includes a flat portion, which is in contact with the coarse moving stage.

7. An exposure apparatus comprising:
   an optical system configured to project, onto a substrate, exposure light which irradiates a master on which a pattern is formed; and
   an alignment apparatus according to claim 1, to hold and align the substrate.

8. A device manufacturing method comprising:
   a preparation step of preparing a substrate on which a latent image pattern is formed using an exposure apparatus according to claim 7, and
   a development step of developing the latent image pattern.

9. The apparatus according to claim 1, wherein
   the coil unit is formed by juxtaposing a first plurality of coils arranged in a first direction in a horizontal plane and a second plurality of coils arranged in a second direction in a horizontal plane such that the first plurality of coils overlap with the second plurality of coils.

* * * * *